(12) United States Patent
Jeon et al.

(10) Patent No.: US 11,769,811 B2
(45) Date of Patent: Sep. 26, 2023

(54) SEMICONDUCTOR DEVICE INCLUDING GATE STRUCTURE AND SEPARATION STRUCTURE

(71) Applicant: Samsung Electronics Co., Ltd., Suwon-si (KR)

(72) Inventors: Yongho Jeon, Hwaseong-si (KR); Sekoo Kang, Hwaseong-si (KR); Keunhee Bai, Suwon-si (KR); Dongseok Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 16 days.

(21) Appl. No.: 17/548,826

(22) Filed: Dec. 13, 2021

(65) Prior Publication Data

US 2022/0102516 A1 Mar. 31, 2022

Related U.S. Application Data

(63) Continuation of application No. 16/820,302, filed on Mar. 16, 2020, now Pat. No. 11,201,224.

(30) Foreign Application Priority Data

May 30, 2019 (KR) .................. 10-2019-0064022

(51) Int. Cl.
*H01L 29/423* (2006.01)
*H01L 29/40* (2006.01)

(52) U.S. Cl.
CPC ........ *H01L 29/4236* (2013.01); *H01L 29/401* (2013.01); *H01L 29/42364* (2013.01)

(58) Field of Classification Search
None
See application file for complete search history.

(56) References Cited

U.S. PATENT DOCUMENTS

| 9,460,968 | B2 | 10/2016 | Lin et al. |
| 9,564,358 | B1 | 2/2017 | Cai et al. |
| 9,627,375 | B2 | 4/2017 | Chang et al. |
| 9,659,930 | B1 | 5/2017 | Yu et al. |
| 10,177,041 | B2 | 1/2019 | Xie et al. |
| 2016/0300755 | A1 | 10/2016 | Gan et al. |
| 2018/0233579 | A1 | 8/2018 | Li et al. |
| 2019/0006345 | A1 | 1/2019 | Wang et al. |
| 2019/0027410 | A1 | 1/2019 | Liou et al. |
| 2019/0035786 | A1 | 1/2019 | Huang et al. |
| 2020/0027981 | A1 | 1/2020 | Park et al. |

*Primary Examiner* — Hsien Ming Lee

(74) *Attorney, Agent, or Firm* — Muir Patent Law, PLLC

(57) ABSTRACT

A semiconductor device includes first and second gate structures respectively on first and second active regions and an insulating layer between the first and second active regions and a separation structure between a first end portion of the first gate structure and a second end portion of the second gate structure and extending into the insulating layer. The separation structure includes a lower portion, an intermediate portion, and an upper portion, a maximum width of the intermediate portion in the first direction is greater than a maximum width of the lower portion in the first direction, and the maximum width of the intermediate portion is greater than a maximum width of the upper portion in the first direction.

20 Claims, 19 Drawing Sheets

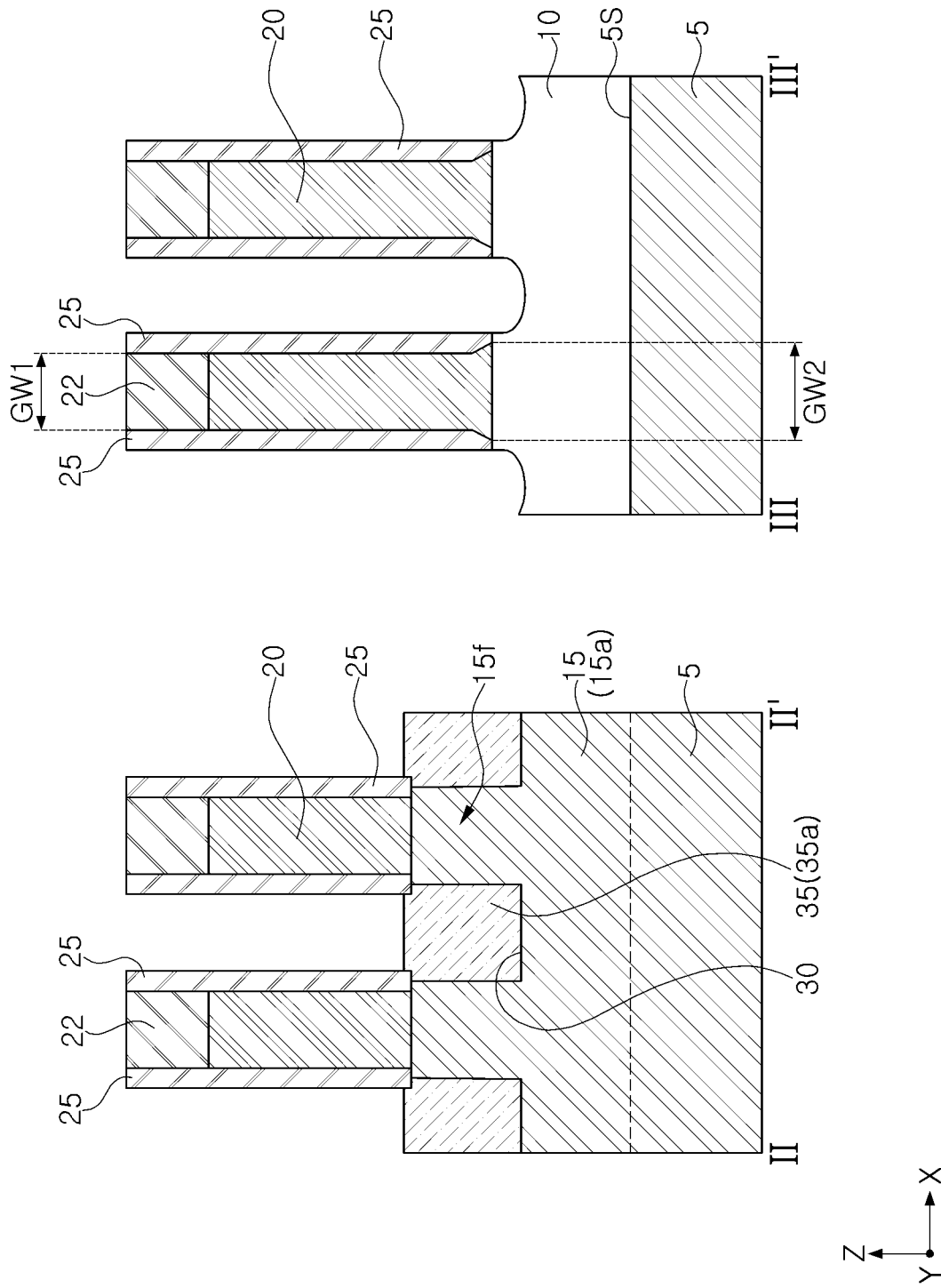

SEMICONDUCTOR DEVICE INCLUDING GATE STRUCTURE AND SEPARATION STRUCTURE

CROSS-REFERENCE TO RELATED APPLICATION(S)

This application is a continuation of U.S. application Ser. No. 16/820,302 filed Mar. 16, 2020, which claims benefit of priority under 35 U.S.C. § 119 to Korean Patent Application No. 10-2019-0064022 filed on May 30, 2019 in the Korean Intellectual Property Office, the disclosure of each of these applications being incorporated herein by reference in its entirety.

BACKGROUND

1. Field

The present inventive concept relates to a semiconductor device, for example, to a semiconductor device including a gate structure and a separation structure and a method of forming the same.

2. Description of Related Art

In order to increase price competitiveness of products, there is a growing demand for improvements in degrees of integration of semiconductor devices. Here, scaling down of a semiconductor device may be performed in order to improve a degree of integration. As integration of semiconductor devices increase, dimensions of gate electrodes/lines of semiconductor devices become smaller and smaller, and distances between gate electrodes/lines decrease gradually.

SUMMARY

An aspect of the present inventive concept is to provide a semiconductor device capable of improving a degree of integration.

An aspect of the present inventive concept is to provide a semiconductor device including a separation structure capable of electrically separating gate structures.

An aspect of the present inventive concept is to provide a method of forming a semiconductor device including a separation structure capable of electrically separating gate structures.

According to an aspect of the present inventive concept, a semiconductor device is provided. The semiconductor device includes: a first active region and a second active region; an insulating layer disposed between the first active region and the second active region; a first gate structure disposed on the first active region and the insulating layer, the first gate structure having a first end portion disposed on the insulating layer; a second gate structure disposed on the second active region and the insulating layer, the second gate structure having a second end portion facing the first end portion of the first gate structure in a first direction, the second gate structure disposed on the insulating layer; and a separation structure disposed between the first end portion of the first gate structure and the second end portion of the second gate structure and extending into the insulating layer. The separation structure includes a lower portion, an intermediate portion on the lower portion, and an upper portion on the intermediate portion, a maximum width of the intermediate portion of the separation structure in the first direction is greater than a maximum width of the lower portion of the separation structure in the first direction, and the maximum width of the intermediate portion of the separation structure in the first direction is greater than a maximum width of the upper portion of the separation structure in the first direction.

According to an aspect of the present inventive concept, a semiconductor device is provided. The semiconductor device includes: a plurality of first gate structures disposed on a substrate and extending in a first direction; a plurality of second gate structures disposed on the substrate and extending in the first direction; and a separation structure disposed on the substrate. The plurality of first gate structures and the plurality of second gate structures have end portions facing each other, the separation structure includes a plurality of lower portions, a plurality of intermediate portions respectively disposed on the plurality of lower portions, and an upper portion disposed on the plurality of intermediate portions, the upper portion includes a plurality of first upper portions respectively extending from the plurality of intermediate portions and one second upper portion disposed on the plurality of first upper portions, the plurality of intermediate portions and the plurality of first upper portions are respectively disposed between end portions of the plurality of first gate structures and end portions of the plurality of second gate structures, each of the plurality of intermediate portions has an extension width in a second direction, each of the plurality of lower portions has a lower width in the second direction, each of the plurality of first upper portions has an upper width in the second direction, and the extension width in the second direction is greater than each of the lower width in the second direction and the upper width in the second direction.

According to an aspect of the present inventive concept, a semiconductor device is provided. The semiconductor device includes: a substrate; an active region and an insulating layer on the substrate; a gate structure on the active region and the insulating layer; and a separation structure in contact with an end portion of the gate structure. The gate structure includes a gate dielectric structure and a gate electrode structure on the gate dielectric structure, the separation structure includes a side wall extending into the insulating layer and being in contact with the end portion of the gate structure, the side wall of the separation structure includes a lower side wall, a first side wall on the lower side wall, a second side wall on the first side wall, and an upper side wall on the second side wall, an inclination of the lower side wall is greater than an inclination of the first side wall with respect to a boundary surface between the gate structure and the insulating layer, the first side wall includes a portion in contact with the insulating layer, the second side wall includes a portion in contact with the gate electrode structure, and a portion of the separation structure defined between the first side wall and the second side wall overlaps the gate electrode structure in a plan view.

BRIEF DESCRIPTION OF DRAWINGS

The above and other aspects, features and other advantages of the present disclosure will be more clearly understood from the following detailed description, taken in conjunction with the accompanying drawings, in which:

FIGS. 14A-14B, 15A-15B, 16A-16B, 17, 18 and 19 are cross-sectional views for describing a method of forming a semiconductor device according to an example embodiment.

DETAILED DESCRIPTION

Figure 1:
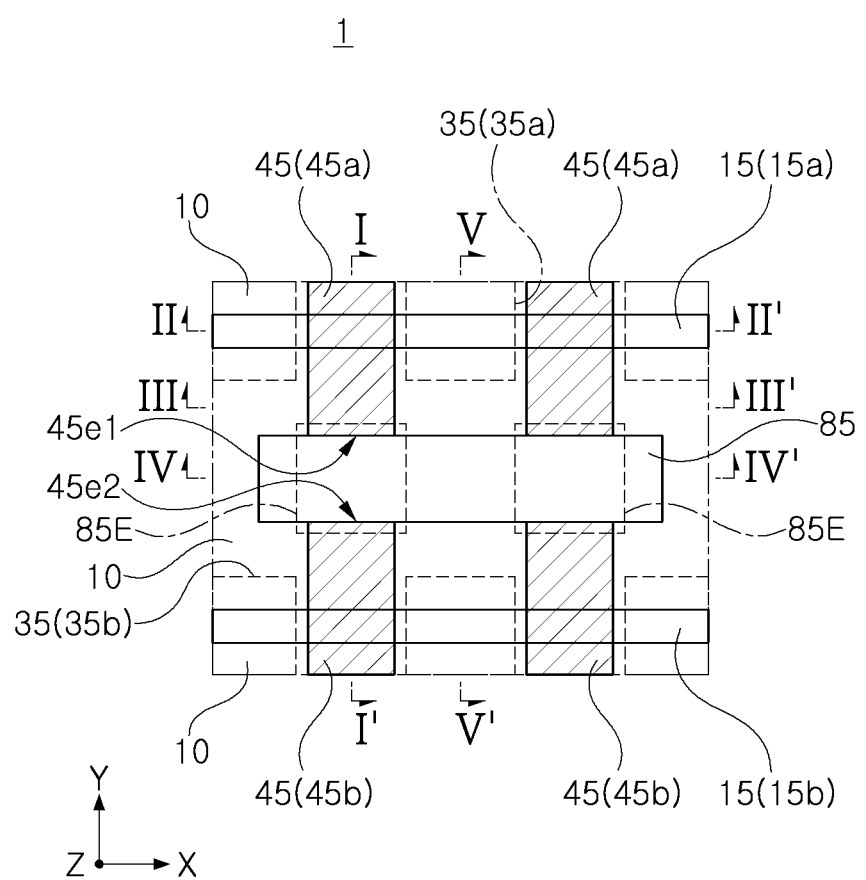
FIG. 1 is a plan view illustrating a semiconductor device according to example embodiments.
Figure 2:
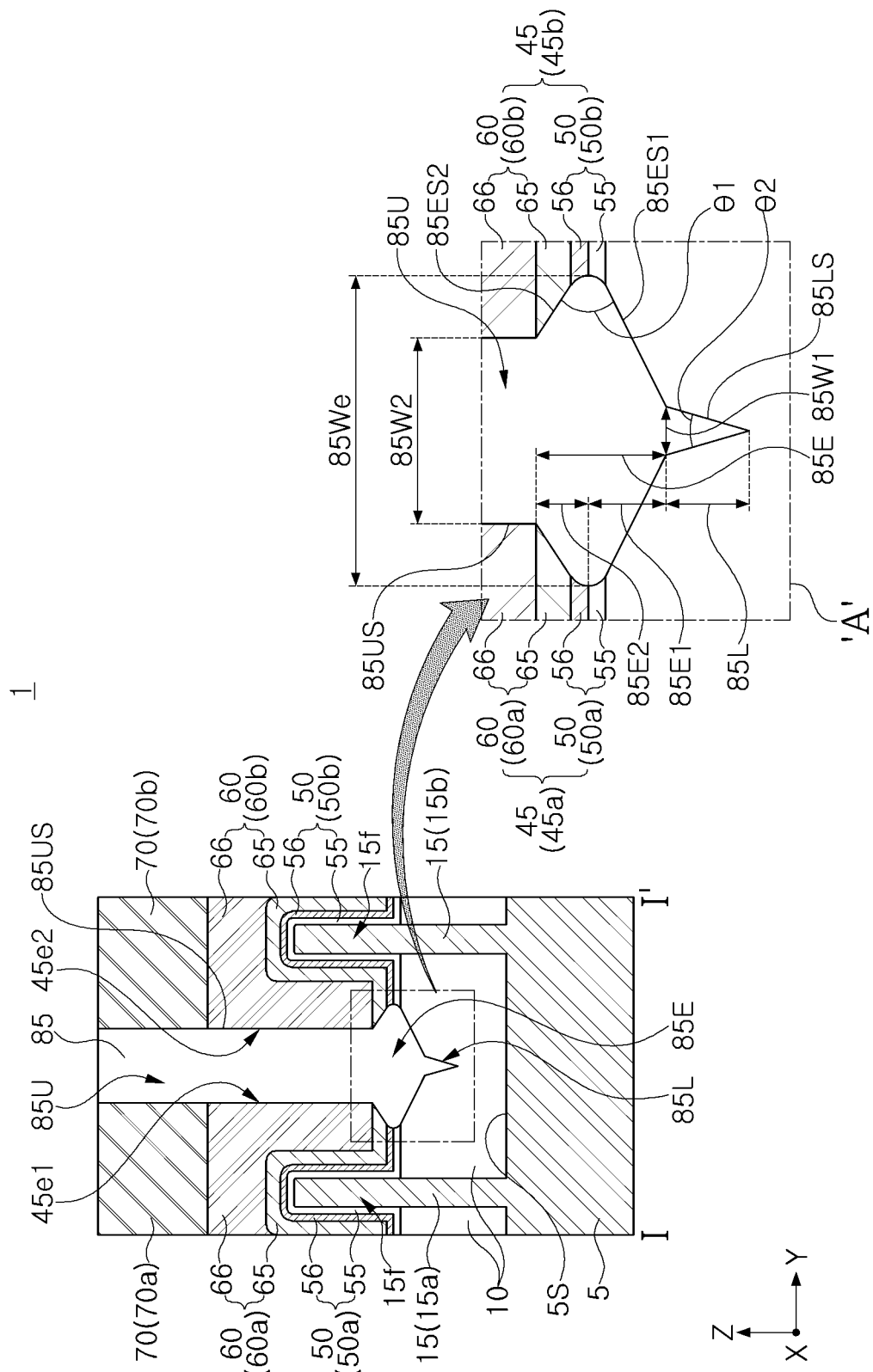
FIGS. 2 to 4 are cross-sectional views illustrating a semiconductor device according to an example embodiment.
Figure 3:
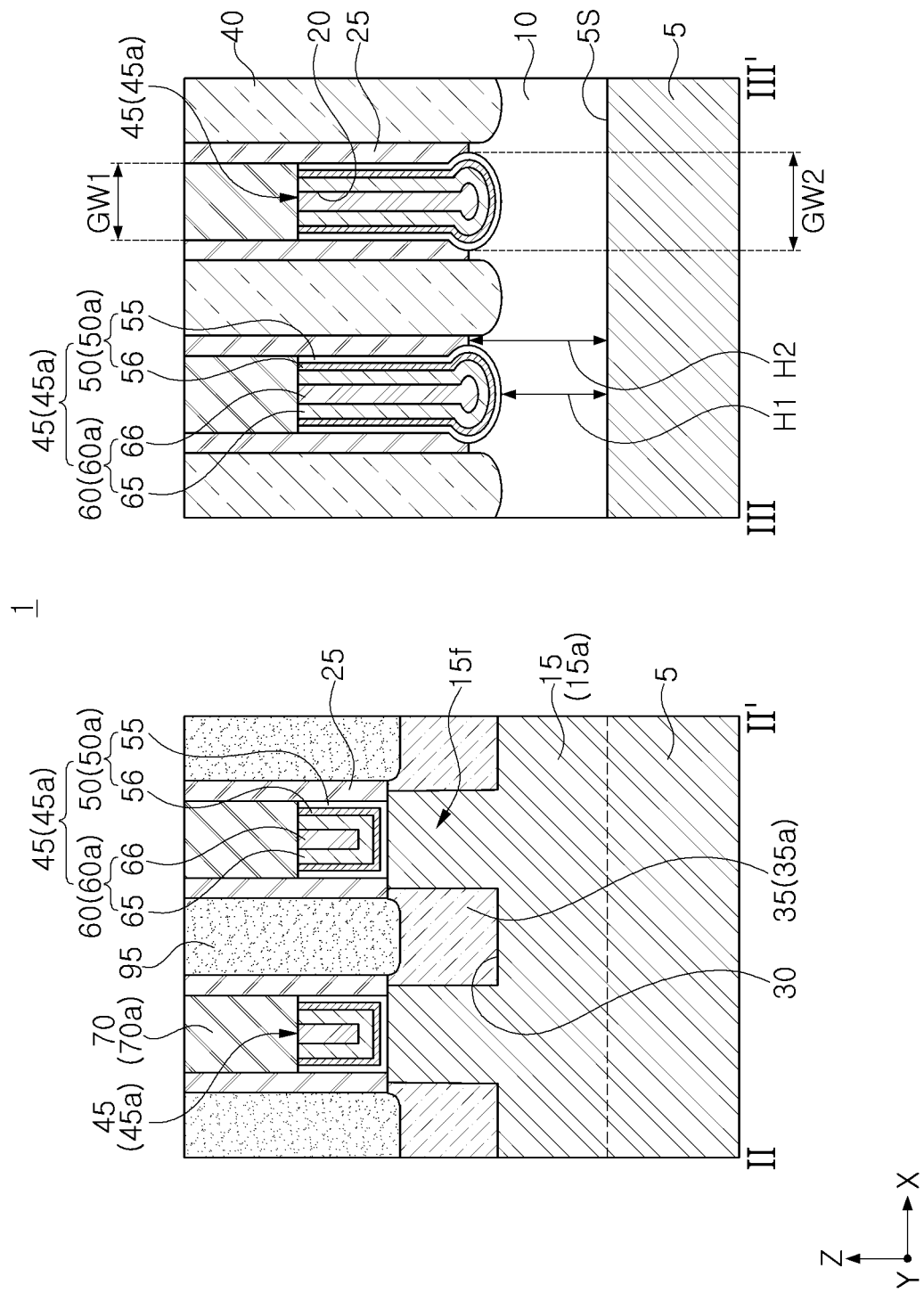
Figure 4:
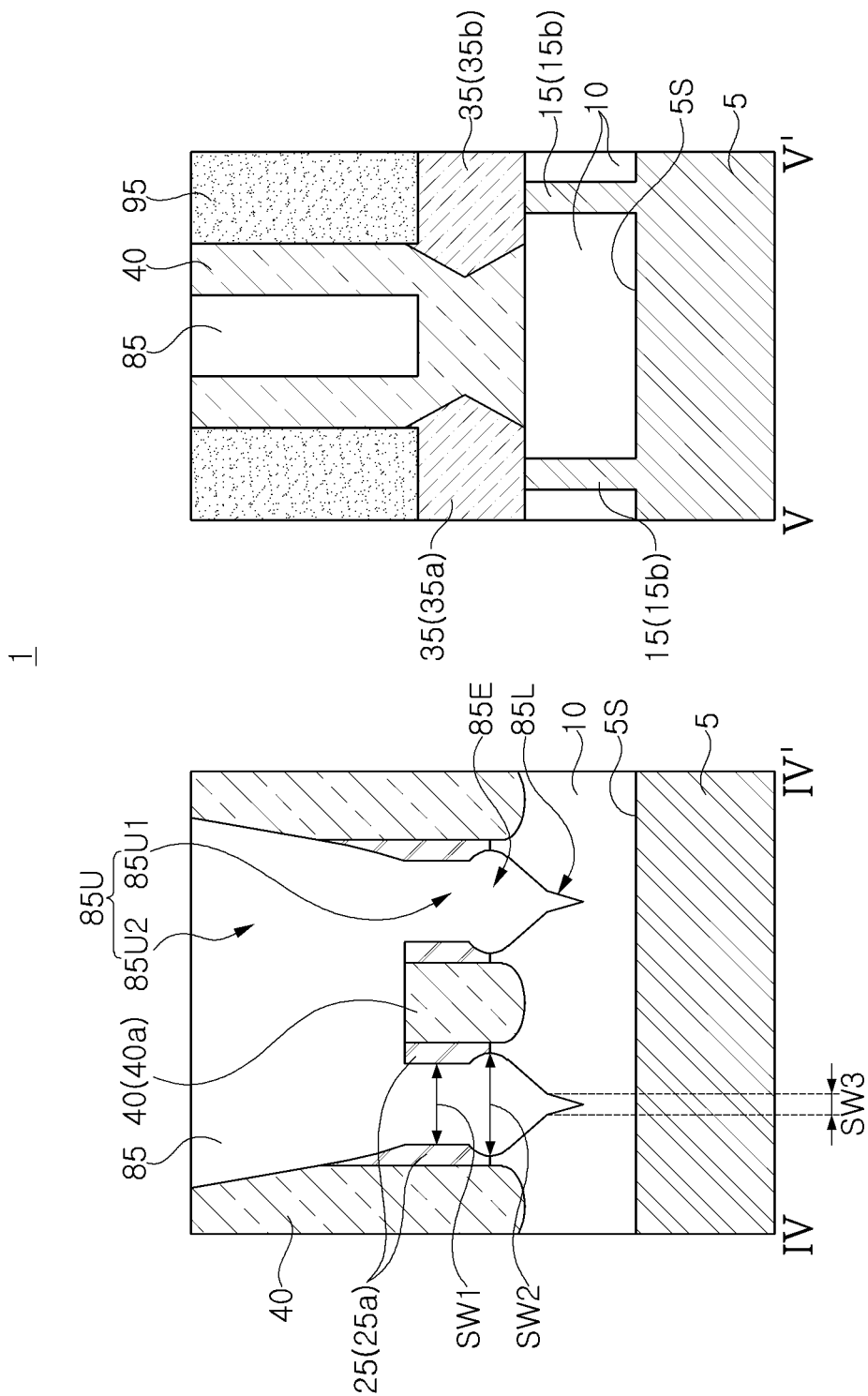

FIG. 1 is a plan view illustrating a semiconductor device 1 according to example embodiments, and FIGS. 2 to 4 are cross-sectional views illustrating an example of a semiconductor device according to an example embodiment.

First, referring to FIG. 1, the semiconductor device 1 according to the example embodiments will be described.

Referring to FIG. 1, the semiconductor device 1 according to the example embodiments may include an insulating layer 10, active regions 15, gate structures 45, and a separation structure 85.

The gate structures 45 may be extended in a first direction Y, while the active regions 15 may be extended in a second direction X intersecting the first direction Y. The first direction Y and the second direction X may be perpendicular to each other.

The active regions 15 and the insulating layer 10 may be adjacent to each other. The insulating layer 10 may be a shallow trench isolation layer defining the active regions 15.

The active regions 15 may include a first active region 15a and a second active region 15b spaced apart from each other, while the insulating layer 10 may include a portion disposed between the first active region 15a and the second active region 15b.

The gate structures 45 may include end portions facing each other. For example, the gate structures 45 may include a first gate structure 45a having a first end portion 45e1 and a second gate structure 45b having a second end portion 45e2 facing the first end portion 45e1.

The first gate structure 45a may be disposed on the first active region 15a and the insulating layer 10. The second gate structure 45b may be disposed on the second active region 15b and the insulating layer 10. The first and second end portions 45e1 and 45e2 may be disposed on the insulating layer 10.

The separation structure 85 may be disposed between the first end portion 45e1 of the first gate structure 45a and the second end portion 45e2 of the second gate structure 45b to electrically isolate/insulate the first gate structure 45a and the second gate structure 45b from each other. The separation structure 85 may be formed of an insulating material. For example, the separation structure 85 may be formed of an insulating material such as silicon nitride (SiN), silicon oxynitride (SiON), or the like.

The separation structure 85 may include an extended portion 85E disposed between the first end portion 45e1 of the first gate structure 45a and the second end portion 45e2 of the second gate structure 45b, and overlapping the first end portion 45e1 of the first gate structure 45a and the second end portion 45e2 of the second gate structure 45b, e.g., in a third/vertical direction Z. The third/vertical direction Z may be perpendicular to the first and second directions Y and X.

In example embodiments, the separation structure 85, including the extended portion 85E, may prevent/reduce leakage current or electrical short, which may occur between the first and second gate structures 45a and 45b respectively having the first and second end portions 45e1 and 45e2 facing each other. Thus, the separation structure 85 including the extended portion 85E may improve reliability and durability of the semiconductor device 1.

The semiconductor device 1 according to example embodiments may further include source/drain regions 35 on the active regions 15 located next to the gate structures 45.

The source/drain regions 35 may include first source/drain regions 35a overlapping the first active region 15a next to the first gate structure 45a and second source/drain regions 35b overlapping the second active region 15b next to the second gate structure 45b.

In an example, a plurality of first gate structures 45a may be provided in the semiconductor device 1, and a plurality of second gate structures 45b may be provided in the semiconductor device 1. For example, the plurality of first gate structures 45a may be parallel to each other and spaced apart from each other in the second direction X, while the plurality of second gate structures 45b may be parallel to each other and spaced apart from each other in the second direction X.

The separation structure 85 may be disposed between first end portions 45e1 of the plurality of first gate structures 45a and second end portions 45e2 of the plurality of second gate structures 45b. Hereinafter, for convenience of explanation, one first gate structure of the plurality of first gate structures 45a and one second gate structure of the plurality of second gate structures 45b will be mainly described.

Next, referring to FIG. 2 illustrating a cross section taken along line I-I' of FIG. 1, the semiconductor device 1 according to an example embodiment will be described.

Referring to FIG. 2, the semiconductor device 1 according to an embodiment may further include a substrate 5. The substrate 5 may be a semiconductor substrate, e.g., formed of silicon, germanium, etc. The insulating layer 10 and the active regions 15, described above referring to FIG. 1, may be disposed on the substrate 5. The first active region 15a and the second active region 15b of the active regions 15 may be extended from the substrate 5 in a vertical direction Z, perpendicular to an upper surface 5S of the substrate 5, to pass through the insulating layer 10. The first active region 15a may include an active fin 15f protruding upward from a portion passing through the insulating layer 10, while the second active region 15b may include an active fin 15f protruding upward from a portion passing through the insulating layer 10.

The first gate structure 45a may be disposed on the first active region 15a and the insulating layer 10, and may have the first end portion 45e1 disposed on the insulating layer 10. The second gate structure 45b may be disposed on the second active region 15b and the insulating layer 10, and may have the second end portion 45e2 spaced apart from the first end portion 45e1 while facing the first end portion 45e1 on the insulating layer 10.

The first gate structure 45a may extend on the insulating layer 10 while surrounding an upper surface and side walls of the active fin 15f of the first active region 15a, while the second gate structure 45b may extend on the insulating layer 10 while surrounding an upper surface and side walls of the active fin 15f of the second active region 15b.

Each of the gate structures 45 may include a gate dielectric structure 50 and a gate electrode structure 60 formed/disposed on the gate dielectric structure 50. For example, the first gate structure 45a may include a first gate dielectric structure 50a and a first gate electrode structure 60a on the first gate dielectric structure 50a, while the second gate structure 45b may include a second gate dielectric structure 50b and a second gate electrode structure 60b on the second gate dielectric structure 50b.

In an example, each of the first and second gate dielectric structures 50a and 50b may include a lower gate dielectric layer 55 and an upper gate dielectric layer 56 formed/disposed on the lower gate dielectric layer 55. For example, the lower gate dielectric layer 55 may include/be a silicon oxide, a silicon oxide doped with a nitrogen element, or a silicon oxide doped with a metal element, while the upper gate dielectric layer 56 may include/be a high-k dielectric material such as HfO, HfSiO, LaO, AlO, or the like.

In an example, each of the first and second gate electrode structures 60a and 60b may include a lower gate electrode layer 65 and an upper gate electrode layer 66. The lower gate electrode layer 65 and the upper gate electrode layer 66 may be formed of different conductive materials. For example, the lower gate electrode layer 65 may be formed of TiC, TiAl, TaAl, HfAl, W, WN, Ti, TiN, TiAl, TiAlC, Ta, TaN, a conductive carbon, or a combination thereof, while the upper gate electrode layer 66 may be formed of a material, different from the material of the lower gate electrode layer 65, such as TiC, TiAl, TaAl, HfAl, W, WN, Ti, TiN, TiAl, TiAlC, Ta, TaN, or a conductive carbon.

The semiconductor device 1 according to an embodiment may further include gate capping patterns 70 disposed on the gate structures 45. The gate capping patterns 70 may include a first gate capping pattern 70a disposed on the first gate structure 45a and a second gate capping pattern 70b disposed on the second gate structure 45b. In an example, the gate capping patterns 70 may be formed of a nitride-based insulating material, for example, silicon nitride.

The separation structure 85 may be extended from a portion, interposed between the first end portion 45e1 of the first gate structure 45a and the second end portion 45e2 of the second gate structure 45b, into the insulating layer 10. The separation structure 85 may be extended from a portion, interposed between the first end portion 45e1 of the first gate structure 45a and the second end portion 45e2 of the second gate structure 45b, into a space between the first gate capping pattern 70a and the second gate capping pattern 70a.

The separation structure 85 may include a lower portion 85L, an extended portion 85E on the lower portion 85L, and an upper portion 85U on the extended portion 85E. For example, the extended portion 85E may be a portion of the separation structure 85 interposed between the lower portion 85L and the upper portion 85U of the separation structure 85. For example, the upper and lower portions 85U and 85L may be referenced with respect to the vertical direction Z, and heights may be relative distances with respect to a top or a bottom surface of the substrate 5. These concepts of 'lower' and 'upper' may also apply to other parts of the present disclosure. The extended portion 85E may extend in the first direction Y so that the extended portion 85E may have a greater length than the lower and upper portions 85L and 85U in the first direction Y.

Throughout the specification, terms such as 'lower,' 'extended,' and 'upper' are used to distinguish relative positions, and the technical concept of the present disclosure is not limited by these terms. For example, in the separation structure 85, the term, 'extended portion 85E' may be used interchangeably with the term 'intermediate portion 85E', 'middle portion 85E' or 'extension portion 85E.' For example, 'extended portion' throughout the disclosure may be interchangeable with 'intermediate portion' in that extended portions are disposed between lower portions and upper portions. Alternatively, in the separation structure 85, the term 'lower portion 85L,' 'extended portion 85E,' and 'upper portion 85U' may be used interchangeably with the term 'first portion 85L,' 'second portion 85E,' and 'third portion 85U.'

In an example, a maximum width 85We of the extended portion 85E of the separation structure 85 in the first direction Y may be greater than a maximum width 85W1 of the lower portion 85L of the separation structure 85 in the first direction Y.

In an example, the maximum width 85We of the extended portion 85E of the separation structure 85 in the first direction Y may be greater than a maximum width 85W2 of the upper portion 85U of the separation structure 85 in the first direction Y. For example, the maximum width 85We of the extended portion 85E may be at least 1.3 times or at least 2 times as wide as the maximum width 85W2 in the first direction Y.

In an example, the maximum width 85W2 of the upper portion 85U of the separation structure 85 in the first direction Y may be greater than the maximum width 85W1 of the lower portion 85L of the separation structure 85 in the first direction Y. For example, the maximum width 85W2 of the upper portion 85U of the separation structure 85 in the first direction Y may be more than about 1.5 times or more than about 2 times as wide as the maximum width 85W1 of the lower portion 85L of the separation structure 85 in the first direction Y.

In an example, the extended portion 85E of the separation structure 85 may include a first extended portion 85E1 and a second extended portion 85E2 disposed on/above the first extended portion 85E1. For example, the first extended portion 85E1 may be a lower portion of the extended portion 85E, and the second extended portion 85E2 may be an upper portion of the extended portion 85E. The first extended portion 85E1 may be referred to as a first intermediate portion, and the second extended portion 85E2 may be referred to as a second intermediate portion.

In an example, the upper portion 85U may have an upper side wall 85US substantially perpendicular to the upper surface 5S of the substrate 5. Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, encompass acceptable variations from exact identicality, including nearly identical layout, location, shapes, sizes, amounts, or other measures within acceptable variations that may occur, for example, due to manufacturing processes. The term "substantially" may be used herein to emphasize this meaning, unless the context or other statements indicate otherwise.

In an example, the first extended portion 85E1 may include a portion of which width is gradually increased in a direction from a lowermost end of the separation structure 85 toward an upper portion of the separation structure 85, that is, in the vertical direction Z, while the second extended portion 85E2 may include a portion of which width is gradually decreased in the vertical direction Z, e.g., from an uppermost portion of the first extended portion 85E1 toward the upper portion 85U. The extended portion 85E of the separation structure may have its maximum width 85We between the first extended portion 85E1 and the second extended portion 85E2. For example, the extended portion 85E of the separation structure may have its maximum width 85We at a boundary at which the first extended portion 85E1 and the second extended portion 85E2 meet each other.

In an example, in the extended portion 85E of the separation structure 85, the maximum length of the second extended portion 85E2 in the vertical direction Z may be less than the maximum length of the first extended portion 85E1 in the vertical direction Z. For example, the maximum length of the first extended portion 85E1 in the vertical direction Z may be at least 1.1 times as long as the maximum length of the second extended portion 85E2 in the vertical direction Z.

In an example, in the separation structure 85, the maximum length of the extended portion 85E in the vertical direction Z may be greater than the maximum length of the lower portion 85L in the vertical direction Z. For example, the maximum length of the extended portion 85E in the vertical direction Z may be at least 1.3 times or at least 2 times as long as the maximum length of the lower portion 85L in the vertical direction Z.

In an example, in the extended portion 85E of the separation structure 85, the first extended portion 85E1 may have a first side wall 85ES1, while the second extended portion 85E2 may have a second side wall 85ES2. The first side wall 85ES1 includes a portion in contact with the insulating layer 10, while the second side wall 85ES2 may include a portion in contact with the gate electrode structures 60. For example, the first and second side walls 85ES1 and 85ES2 may respectively include portions linearly inclined with respect to the vertical direction Z in a cross-sectional view. In the separation structure 85, a portion of the separation structure 85, defined between the first side wall 85ES1 and the second side wall 85ES2, for example, the extended portion 85E may overlap the gate structures 45, e.g., in the vertical direction Z and/or in a plan view.

In an example, a length of the second side wall 85ES2 of the second extended portion 85E2 may be less than a length of the first side wall 85ES1 of the first extended portion 85E1.

In an example, the second side wall 85ES2 of the second extended portion 85E2 and the first side wall 85ES1 of the first extended portion 85E1 may form a first angle θ1, e.g., in a cross-sectional view.

In an example, the lower portion 85L of the separation structure 85 may include a portion of which a width is gradually increased in the vertical direction Z. For example, the lower portion 85L of the separation structure 85 may have lower side walls 85LS forming a second angle θ2, e.g., in a cross-sectional view. Thus, the lower portion 85L of the separation structure 85 may have a shape pointed in a direction toward the upper surface 5S of the substrate 5. For example, the lower portion 85L of the separation structure 85 may protrude toward the upper surface 5S of the substrate 5. For example, the side walls 85LS may be inclined with respect to the vertical direction Z and may have a smaller acute angle than an acute angle formed between the vertical direction Z and the first side wall 85ES1 in a cross-sectional view. For example, the first side wall 85ES1 and the lower side wall 85LS may contact each other at a boundary between the lower portion 85L and the extended portion 85E. For example, the first side wall 85ES1 and the lower side wall 85LS may form an angle at the boundary between the lower portion 85L and the extended portion 85E in a cross-sectional view.

In an example, the first angle θ1 between the first side wall 85ES1 of the first extended portion 85E1 and the second side wall 85ES2 of the second extended portion 85E2 may be greater than the second angle θ2 between the lower side walls 85LS of the lower portion 85L of the separation structure 85.

The separation structure 85 may include a side wall extended into the insulating layer 10 while being in contact with an end portion of one gate structure among the gate structures 45, the side wall of the separation structure 85 may include the lower side wall 85LS, the first side wall 85ES1 disposed on/above the lower side wall 85LS, the second side wall 85ES2 disposed on/above the first side wall 85ES1, and the upper side wall 85US disposed on/above the second side wall 85ES2, and an inclination of the lower side wall 85LS may be greater than an inclination of the first side wall 85ES1, when viewed in a direction based on a boundary surface between the gate structures 45 and the insulating layer 10. For example, the lower side wall 85LS may be steeper than the first side wall 85ES1 with respect to a horizontal plane perpendicular to the vertical direction. In certain embodiments, steepnesses of the first and second side walls may be substantially the same. For example, absolute values of the slopes of the first and second side walls 85ES1 and 85ES2 may be the same with respect to the horizontal plane when measured on a plane parallel to the first and vertical directions Y and Z.

Next, referring to FIG. 3, illustrating a region of a cross section taken along line II-II' of FIG. 1 and illustrating a region of a cross section taken along line III-III' of FIG. 1, the semiconductor device 1 according to an example embodiment will be described. Here, for convenience of explanation, one active region, among the plurality of active regions 15 described with reference to FIG. 1, will mainly be described.

Referring to FIG. 3, a semiconductor device 1 according to an embodiment may further include gate spacers 25, contact plugs 95, and an interlayer insulating layer 40.

One active region 15, extended in the second direction X, may include a plurality of active fins 15f arranged in the second direction X. The gate structures 45 may be disposed on the active fins 15f.

The source/drain regions 35 are disposed on the active region 15 and may be disposed in recesses 30 between the active fins 15f of the active region 15. For example, when the active region 15 is the first active region 15a, the first source/drain regions 35a, among the source/drain regions 35, are disposed on the first active region 15a, and may be disposed between the active fins 15f of the first active region 15a. The contact plugs 95 may be disposed on the source/drain regions 35 and electrically connected to the source/ drain regions 35. The gate spacers 25 may be disposed on side walls of the gate structures 45 and side walls of the gate capping patterns 70.

The interlayer insulating layer 40 may be disposed on the insulating layer 10. On the insulating layer 10, the gate structures 45 and the gate capping patterns 70 may pass through the interlayer insulating layer 40.

On the insulating layer 10, the gate spacers 25 may be interposed between side walls of the gate structures 45 and the interlayer insulating layer 40, and between the gate capping patterns 70 and the interlayer insulating layer 40. On the active regions 15, the gate spacers 25 may be interposed between side walls of the gate structures 45 and the contact plugs 95, and between the gate capping patterns 70 and the contact plugs 95.

In an example, the gate dielectric structure 50 may be extended to a side surface of the gate electrode structure 60 while covering a lower surface of the gate electrode structure 60.

On the insulating layer 10, a distance H1 between a lower end of each of the gate structures 45 and the upper surface 5S of the substrate 5 may be less than a distance H2 between a lower end of each of the gate spacers 25 and the upper surface 5S of the substrate 5. For example, the distances H1 and H2 may be distances in the vertical direction Z.

On the insulating layer 10, each of the gate structures 45 may have a width GW2, increased in a region adjacent to a lower end portion of the gate spacers 25, e.g., compared to an upper portion of the gate structures 45. For example, on the insulating layer 10, each of the gate structures 45 may have substantially the same width between the gate spacers 25 located at a higher level than a lower end portion of the gate spacers 25, may have its maximum width GW2 in a region adjacent to a lower end portion of the gate spacers 25, and may be extended into the insulating layer 10.

Next, referring to FIG. 4, illustrating a region of a cross section taken along line IV-IV' of FIG. 1 and illustrating a region of a cross section taken along line V-V' of FIG. 1, the semiconductor device 1, according to an example embodiment, will be described.

Referring to FIGS. 1 and 4, as described with reference to FIG. 2, the separation structure 85 may include the lower portion 85L, the extended portion 85E disposed on/over the lower portion 85L, and the upper portion 85U disposed on/over the extended portion 85E.

In an example, as described with reference to FIG. 1, a plurality of first gate structures 45a may be provided to contact a separation structure 85, and a plurality of second gate structures 45b may be provided to contact the separation structure 85.

When the plurality of first gate structures 45a is provided to contact a separation structure 85 and the plurality of second gate structures 45b is provided to contact the separation structure 85, a plurality of corresponding lower portions 85L may be provided in the separation structure 85, and a plurality of extended portions 85E may be provided in the separation structure 85. Thus, the separation structure 85 may include the plurality of lower portions 85L and the plurality of extended portions 85E. The upper portion 85U may include a plurality of first upper portions 85U1 and one second upper portion 85U2 disposed on the plurality of first upper portions 85U1 and connected to the plurality of first upper portions 85U1. The plurality of first upper portions 85U1 may be disposed on the plurality of extended portions 85E. The second upper portion 85U2 may have a bar or line shape extended in the second direction X. As described with reference to FIG. 1, the gate structures 45 may be extended in the first direction Y. The second direction X may be perpendicular to the first direction Y. The first direction Y and the second direction X may be parallel to the upper surface 5S of the substrate 5.

The plurality of extended portions 85E and the plurality of first upper portions 85U1 may be disposed between first end portions 45e1 of the plurality of first gate structures 45a and second end portions 45e2 of the plurality of second gate structures 45b. The plurality of extended portions 85E may be extended from a portion located between the first end portions 45e1 of the plurality of first gate structures 45a and the second end portions 45e2 of the plurality of second gate structures 45b into the insulating layer 10.

Each of the plurality of extended portions 85E may have an extension width SW2 in the second direction X, each of the plurality of lower portions 85L may have a lower width SW3 in the second direction X, each of the plurality of first upper portions 85U1 may have an upper width SW1 in the second direction X, and the extension width SW2 in the second direction X may be greater than each of the lower width SW3 in the second direction X and the upper width SW1 in the second direction X. For example, the upper width SW1 may be the maximum width of the corresponding first upper portion 85U1 in the second direction X, the extension width SW2 may be the maximum width of the corresponding extended portion 85E in the second direction X, and the lower width SW3 may be the maximum width of the corresponding lower portion 85L in the second direction X. For example, the extension width SW2 in the second direction X may be at least 1.2 times or at least 2 times as wide as the upper width SW1 in the second direction X, and the extension width SW2 in the second direction X may be more than about 1.1 times or more than about 2 times as wide as the lower width SW3 in the second direction X.

In an example, a portion 40a of the interlayer insulating layer 40 may be disposed between the second upper portion 85U2 and the insulating layer 10, and between the plurality of first upper portions 85U1.

In an example, a portion 25a of the gate spacers 25 may be disposed between side walls of each of the plurality of first upper portions 85U1 and the interlayer insulating layer 40.

In an example, a portion of the interlayer insulating layer 40 may be disposed between the contact plugs 95, while a portion of the separation structure 85 may be disposed in the interlayer insulating layer 40 disposed between the contact plugs 95.

Next, referring to each of FIGS. 5 to 8, various modified example embodiments of an enlarged region of a portion indicated by 'A' of FIG. 2 will be described. Hereinafter, in the description with reference to each of FIGS. 5 to 8, a modified component, among the components described previously, will be mainly described.

Figure 5:
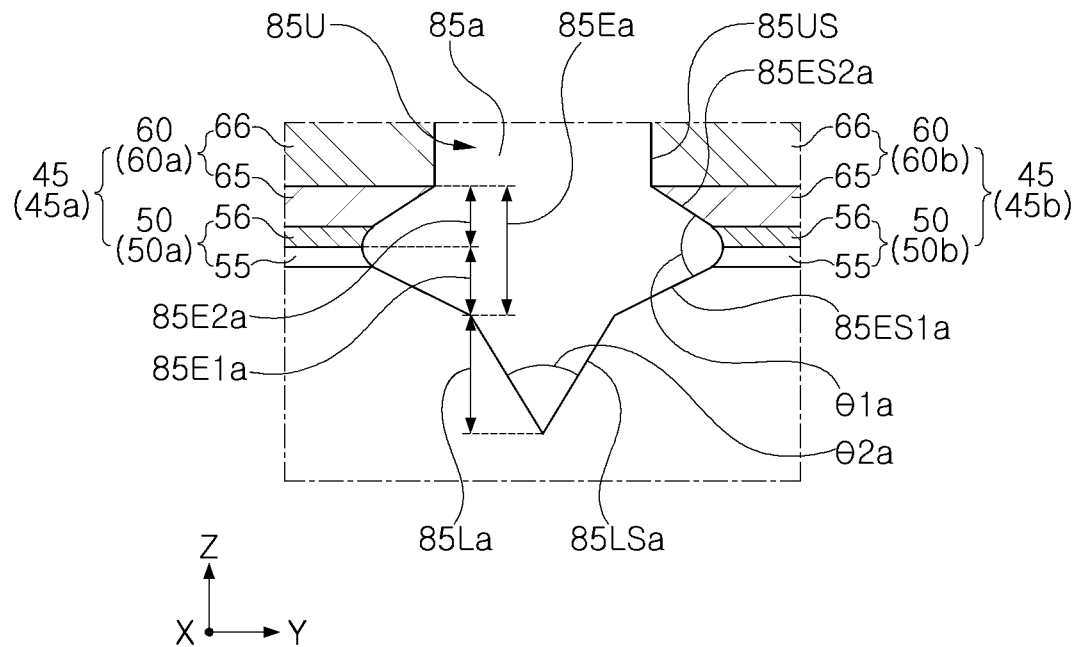
FIG. 5 is a partially enlarged view illustrating a semiconductor device according to a modified example embodiment.

In a modified example embodiment, referring to FIG. 5, a modified separation structure 85a may include a lower portion 85La, an extended portion 85Ea on the lower portion 85La, and an upper portion 85Ua on the extended portion 85Ea. The extended portion 85Ea of the separation structure 85a may include a first extended portion 85E1a and a second extended portion 85E2a on the first extended portion 85E1a.

In an example, the first extended portion 85E1a may have an inclined first side wall 85ES1a, while the second extended portion 85E2a may have an inclined second side wall 85ES2a. The lower portion 85La may have inclined lower side walls 85LSa.

In an example, an angle θ2a between the lower side walls 85LSa of the lower portion 85La may be greater than an angle θ1a between the first side wall 85ES1a of the first extended portion 85E1a and the second side wall 85ES2a of the second extended portion 85E2a.

Figure 6:
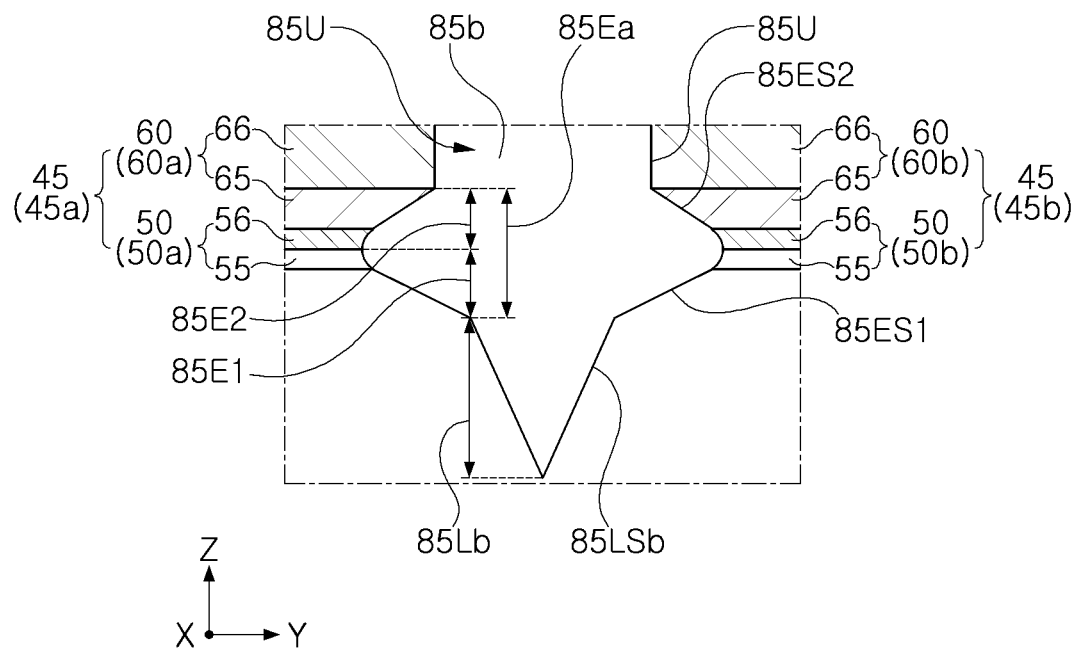
FIG. 6 is a partially enlarged view illustrating a semiconductor device according to a modified example embodiment.

In a modified example embodiment, referring to FIG. 6, a modified separation structure 85b may include a lower portion 85Lb, an extended portion 85Ea on the lower portion 85Lb, and an upper portion 85U on the extended portion 85Ea. The maximum length of the lower portion 85Lb in the vertical direction Z may be greater than the maximum length of the extended portion 85Ea in the vertical direction Z.

Figure 7:
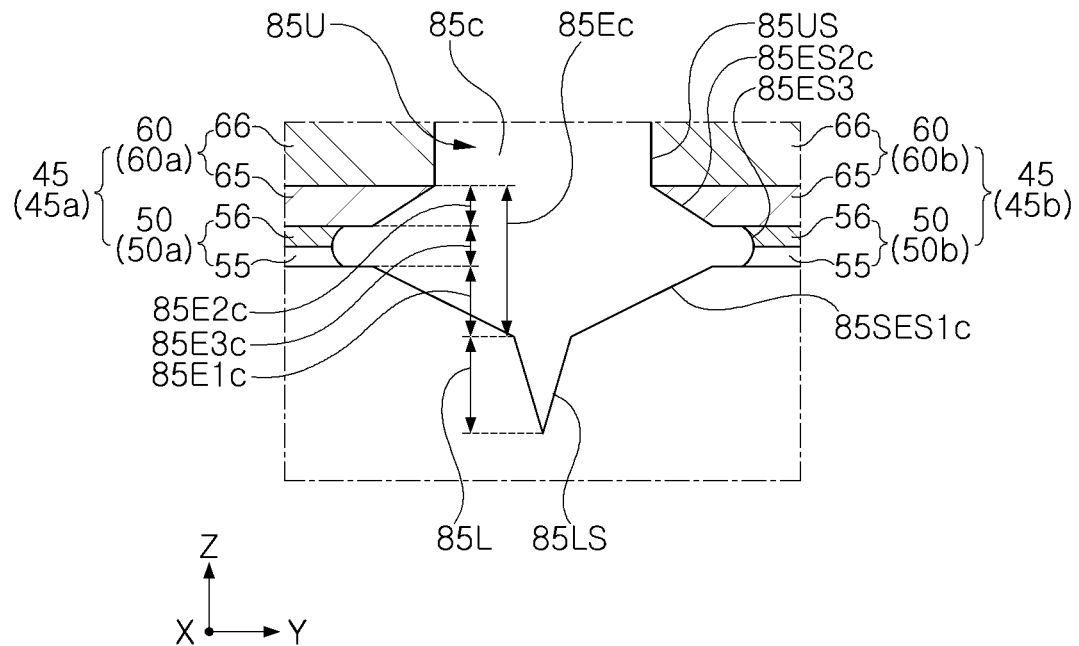
FIG. 7 is a partially enlarged view illustrating a semiconductor device according to a modified example embodiment.

In a modified example embodiment, referring to FIG. 7, a modified separation structure 85c may include a lower portion 85L, an extended portion 85Ec on the lower portion 85L, and an upper portion 85U on the extended portion 85Ec.

In an example, the extended portion 85Ec of the separation structure 85c may include a first extended portion 85E1c, a second extended portion 85E2c on/above the first extended portion 85E1c, and a third extended portion 85E3c between the first extended portion 85E1c and the second extended portion 85E2c.

In an example, the extended portion 85Ec of the separation structure 85c may have its maximum width in the third extended portion 85E3c, e.g., in the first direction Y.

In an example, the first extended portion 85E1c may have an inclined first side wall 85ES1c, while the second extended portion 85E2c may have an inclined second side wall 85ES2c.

In an example, the third extended portion 85E3c may be extended between the gate electrode structure 60 and the insulating layer 10. Thus, an upper surface of the third extended portion 85E3c may be in contact with a lower surface of the gate electrode structure 60, a lower surface of the third extended portion 85E3c may be in contact with an upper surface of the insulating layer 10, and a side wall of the third extended portion 85E3c may be in contact with the gate dielectric structure 50.

Figure 8:
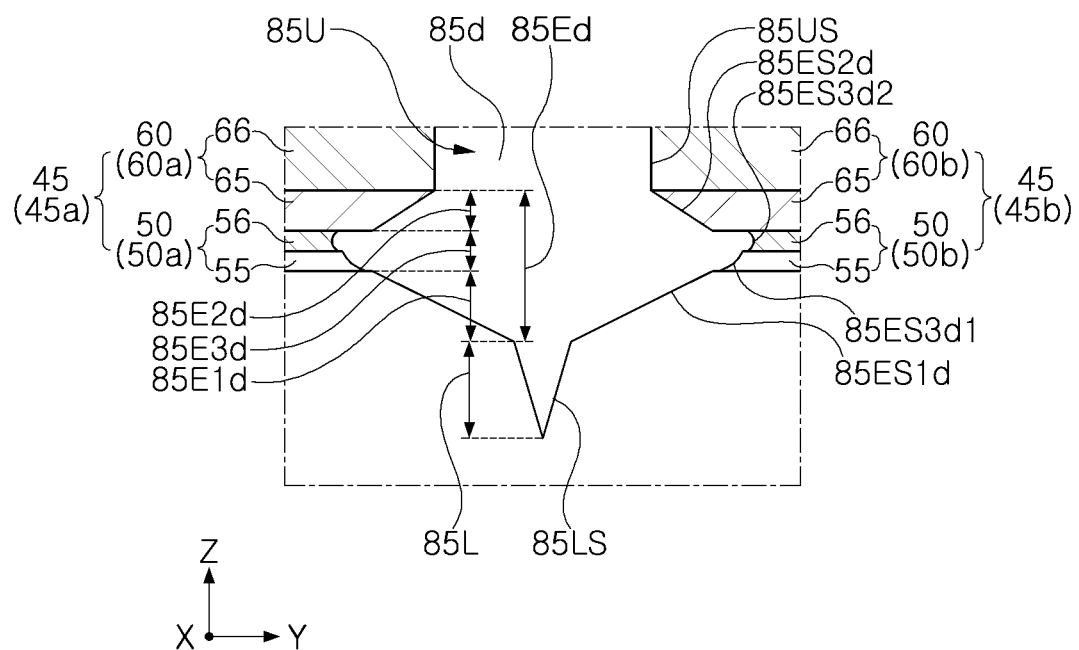
FIG. 8 is a partially enlarged view illustrating a semiconductor device according to a modified example embodiment.

In a modified example embodiment, referring to FIG. 8, a modified separation structure 85d may include a lower portion 85L, an extended portion 85Ed on the lower portion 85L, and an upper portion 85U on the extended portion 85Ed. The extended portion 85Ed of the separation structure 85d may include a first extended portion 85E1d, a second extended portion 85E2d on/above the first extended portion 85E1d, and a third extended portion 85E3d between the first extended portion 85E1d and the second extended portion 85E2d. The first extended portion 85E1d may have an inclined first side wall 85ES1d, while the second extended portion 85E2d may have an inclined second side wall 85ES2d. The third extended portion 85E3d may be extended between the gate electrode structures 60 and the insulating layer 10.

The third extended portion 85E3d may include a first extension side wall 85ES3d1 and a second extension side wall 85ES3d2. The first extension side wall 85ES3d1 may be in contact with the lower gate dielectric layer 55, while the second extension side wall 85ES3d2 may be in contact with the upper gate dielectric layer 56. When viewed in a direction based on the upper side wall 85US of the upper portion 85U, the upper gate dielectric layer 56 may be recessed deeper than the lower gate dielectric layer 55. Thus, the maximum width of an upper region of the third extended portion 85E3d may be greater than the maximum width of a lower region of the third extended portion 85E3d. The third extended portion 85E3d may have its maximum width in an upper region of the third extended portion 85E3d, in contact with the lower gate dielectric layer 55.

Next, referring to each of FIGS. 9 and 10, various modified example embodiments of a region indicated by 'A' of FIG. 2 will be described. Hereinafter, in the description with reference to each of FIGS. 9 and 10, among the components described previously, a modified gate dielectric structure 50 will be mainly described.

Figure 9:
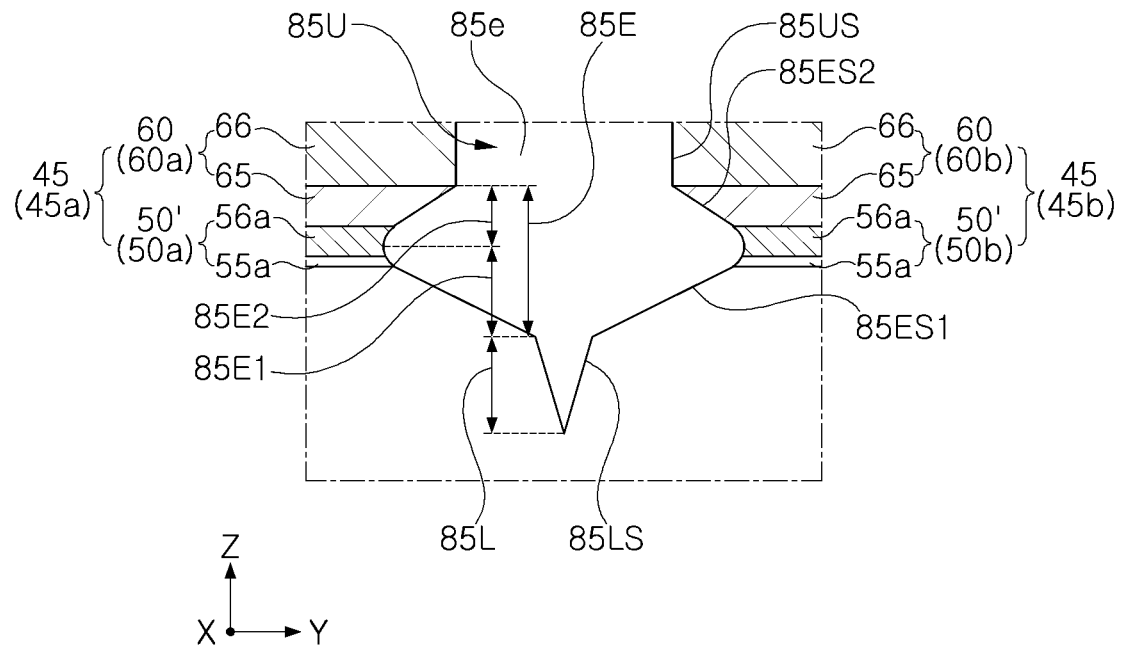
FIG. 9 is a partially enlarged view illustrating a semiconductor device according to a modified example embodiment.

In a modified example embodiment, referring to FIG. 9, a modified gate dielectric structure 50' may include a lower gate dielectric layer 55a having a first thickness and an upper gate dielectric layer 56a having a second thickness greater than the first thickness. For example, the lower and upper gate dielectric layers 55a and 56a may have different thicknesses from each other.

Figure 10:
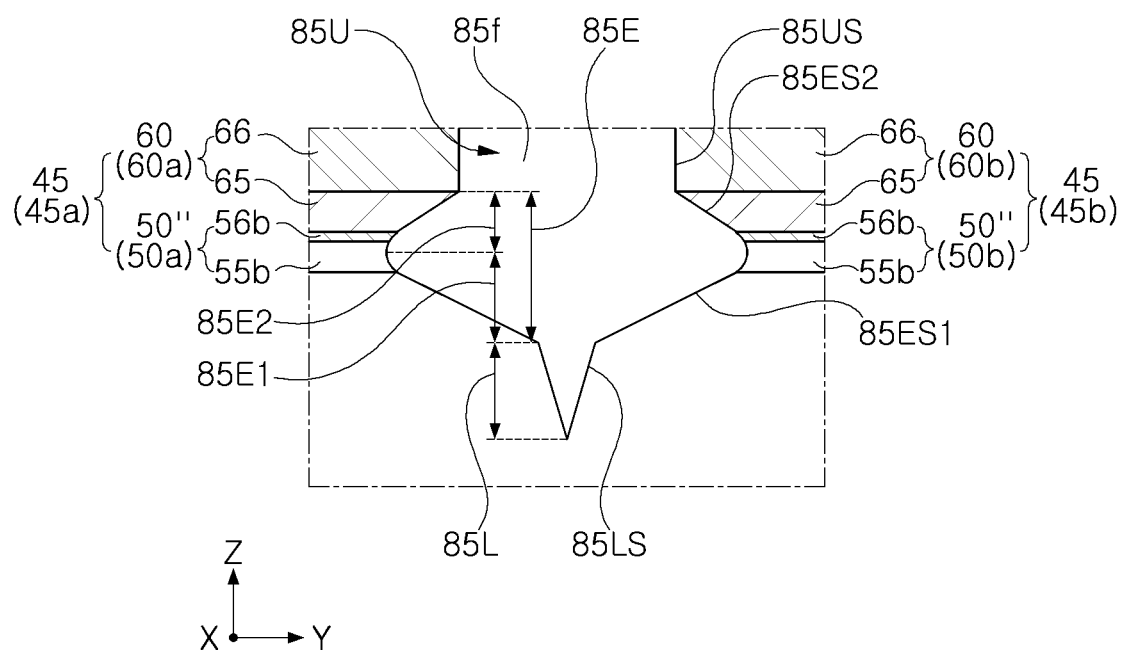
FIG. 10 is a partially enlarged view illustrating a semiconductor device according to a modified example embodiment.

In a modified example embodiment, referring to FIG. 10, a modified gate dielectric structure 50" may include a lower gate dielectric layer 55b having a first thickness and an upper gate dielectric layer 56b having a second thickness less than the first thickness.

Figure 11:
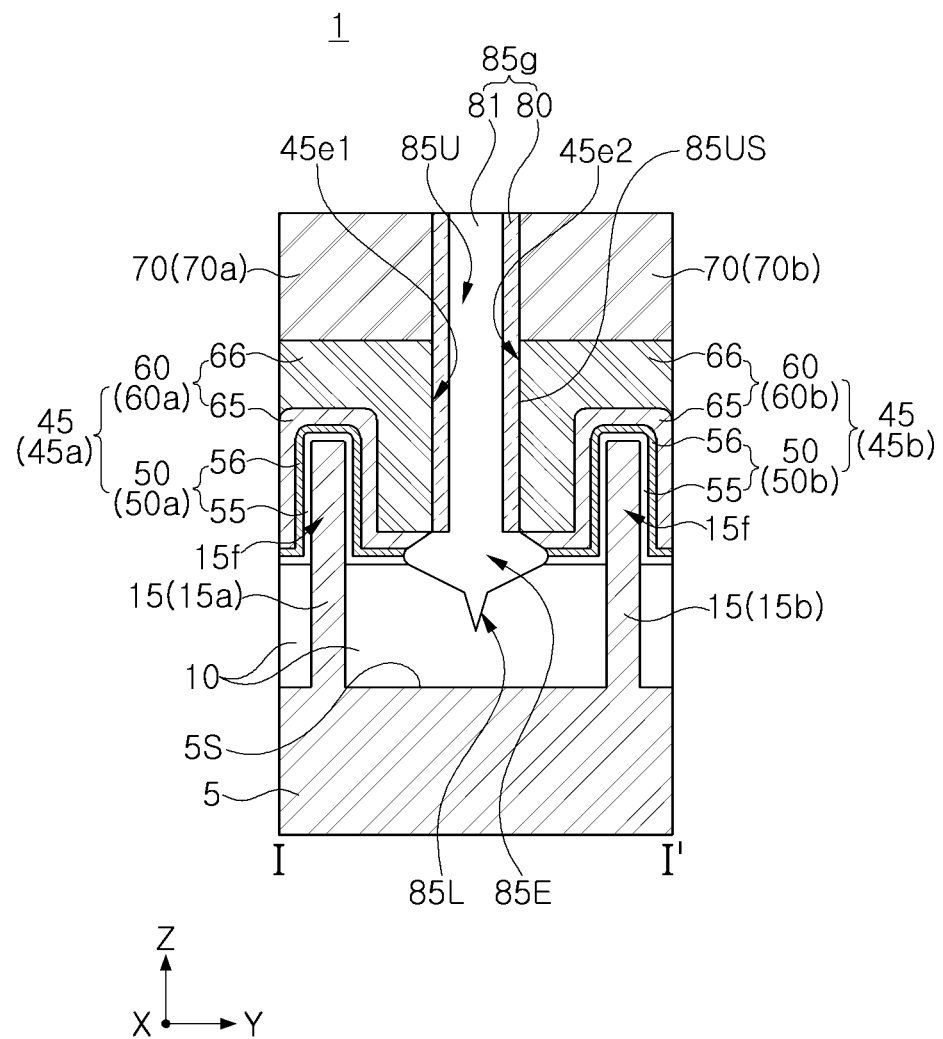
FIG. 11 is a cross-sectional view illustrating a semiconductor device according to a modified example embodiment.
Figure 12:
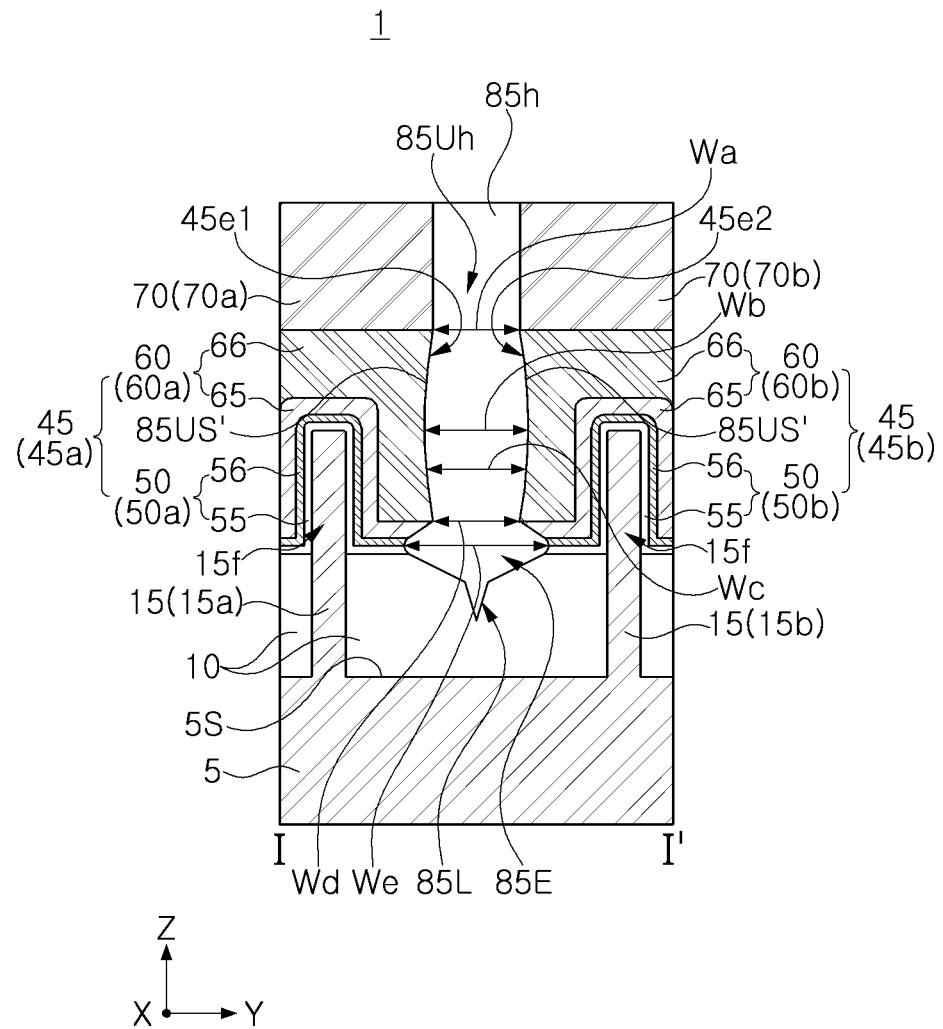
FIG. 12 is a cross-sectional view illustrating a semiconductor device according to a modified example embodiment.

Next, referring to each of FIGS. 11 and 12 illustrating a region of a cross section taken along line I-I' of FIG. 1, modified examples of the separation structure 85, described previously, will be described.

In a modified example embodiment, referring to FIG. 11, a modified separation structure 85g may include a separation gap-fill pattern 81 and separation spacers 80. The separation structure 85g may include the lower portion 85L, the extended portion 85E on the lower portion 85L, and the upper portion 85U on the extended portion 85E, as described with reference to FIG. 2.

The separation gap-fill pattern 81 may form the lower portion 85L and the extended portion 85E. The separation gap-fill pattern 81 is extended upwardly from the extended portion 85E to form the upper portion 85U together with the separation spacers 80. In the upper portion 85U, the separation spacer 80 may be interposed between the gate structures 45 and the separation gap-fill pattern 81.

In a modified example embodiment, referring to FIG. 12, a modified separation structure 85h may include a modified upper portion 85Uh, in addition to the lower portion 85L and the extended portion 85E on the lower portion 85L, as described with reference to FIG. 2.

The upper portion 85Uh may include upper side walls 85US' in contact with the gate structures 45. The upper side walls 85US' may be curved in a direction toward the gate structures 45 in the upper portion 85Uh. For example, the upper portion 85Uh may have a convex shape protruding both ways in the first direction Y.

The upper portion 85Uh may have a first width Wa at the same level as upper surfaces of the gate structures 45, may have a second width Wb at the same level as upper surfaces of the active fins 15f, may have a third width Wc at the same level as middle portions of the active fins 15f, and may have a fourth width Wd at the same level as a boundary between the upper portion 85Uh and the extended portion 85E.

In an example, the second width Wb may be greater than each of the first width Wa, the third width Wc, and the fourth width Wd.

In an example, the third width Wc may be greater than the fourth width Wd.

In an example, the maximum width We of the extended portion 85E may be greater than each of the first width Wa, the second width Wb, the third width Wc, and the fourth width Wd.

Figure 13:
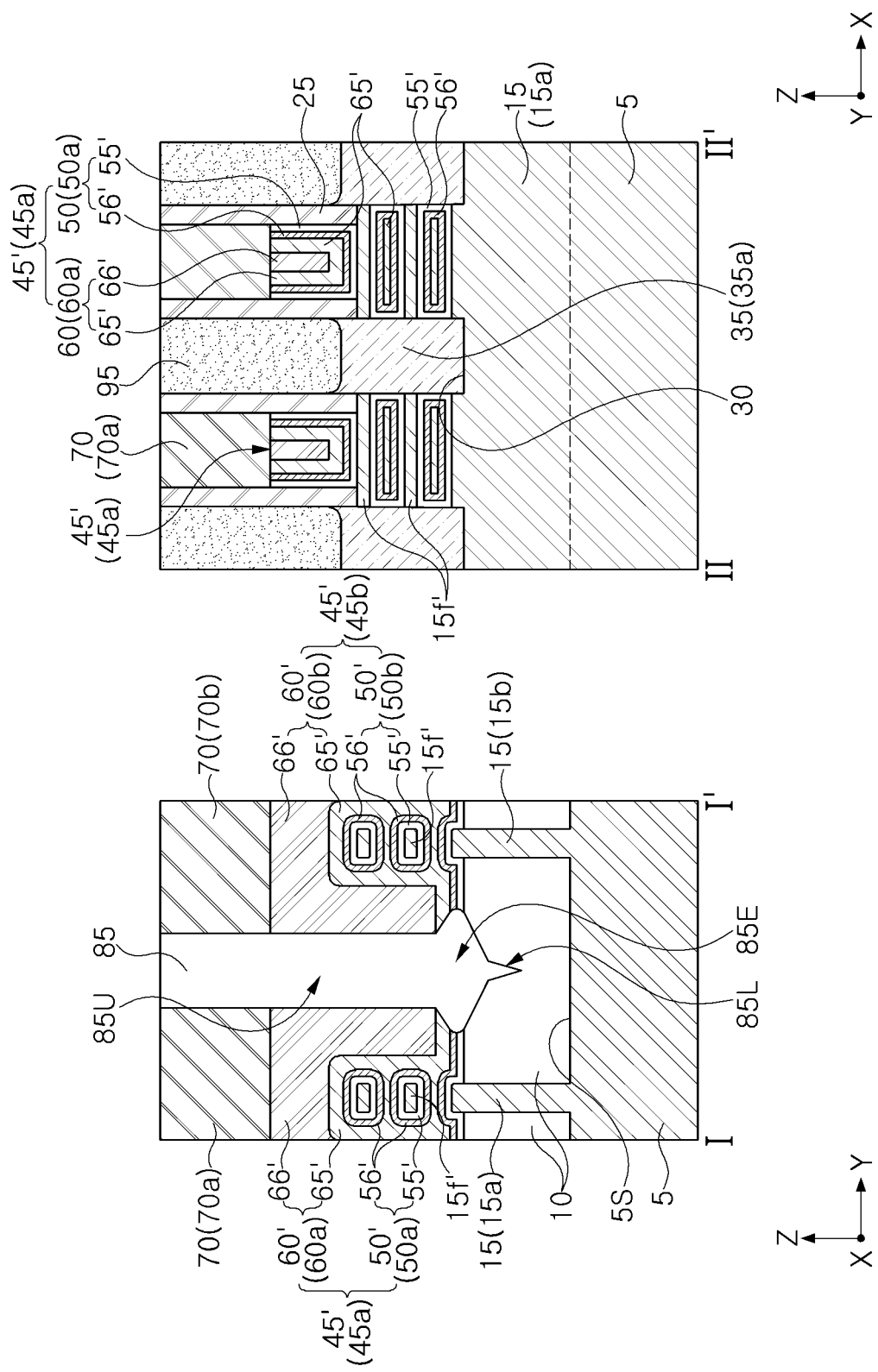
FIG. 13 is a cross-sectional view illustrating a semiconductor device according to a modified example embodiment.

Next, referring to FIG. 13 illustrating a region of a cross section taken along line I-I' of FIG. 1 and a region of a cross section taken along line II-IF of FIG. 1, a modified example of the previously described active fins 15f and gate structures 45 will be described below.

Referring to FIG. 13, the active fins (15f of FIGS. 2 and 3), described previously, may be replaced with active layers 15f spaced apart from the active regions 15. The gate structures (45 of FIGS. 2 and 3), described previously, may be replaced with gate structures 45', modified to surround an upper surface, a lower surface, and side surfaces of each of the active layers 15f. For example, the gate structures 45' may surround an upper surface, a lower surface, and side surfaces of the active layers 15f. On the active regions 15, the gate spacers 25 may be disposed on side walls of gate structures 45', located at a higher level than the active layers 15f'.

Each of the gate structures 45' may include a gate dielectric structure 50' and a gate electrode structure 60' on the gate dielectric structure 50'. For example, the gate dielectric structure 50' may include a lower gate dielectric layer 55' and an upper gate dielectric layer 56' on the lower gate dielectric layer 55', while the gate electrode structure 60' may include a lower gate electrode layer 65' and an upper gate electrode layer 66' on the lower gate electrode layer 65'. The gate dielectric structure 50' may surround an upper surface, a lower surface, and side surfaces of each of the active layers 15f'. At least a portion of the gate electrode structure 60' may surround an upper surface, a lower surface, and side surfaces of each of the active layers 15f'.

Next, referring to FIGS. 1, and 14A to 19, an example of a method of forming a semiconductor device according to an example embodiment will be described. In FIGS. 14A to 19, FIGS. 14A, 15A, 16A, 17, 18, and 19 are cross-sectional views illustrating a region taken along line I-I' of FIG. 1, while FIGS. 14B, 15B, and 16B are cross-sectional views illustrating a region taken along line II-IF and a region taken along line III-III' of FIG. 1.

Figure 14A:
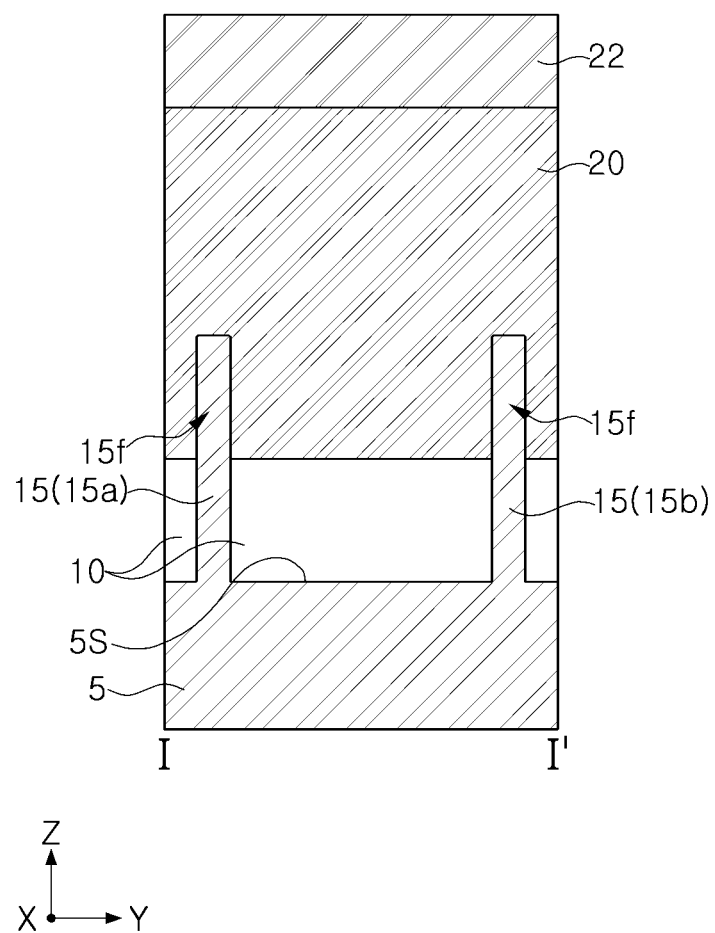

Referring to FIGS. 1, 14A, and 14B, an insulating layer 10 defining an active regions 15 may be formed on a substrate 5. The substrate 5 may be a semiconductor substrate. The insulating layer 10 may be a shallow trench isolation layer.

A portion of the insulating layer 10 is etched to expose a portion of the active regions 15. In the active regions 15, portions protruding from the insulating layer 10 may be defined as active fins 15f.

Sacrificial gate patterns 20 may be formed on the insulating layer 10 and the active regions 15.

In an example, the sacrificial gate patterns 20 may be extended in the first direction Y, while the active regions 15 may be extended in the second direction X perpendicular to the first direction Y. The sacrificial gate patterns 20 may cross the active regions 15.

In an example, forming the sacrificial gate patterns 20 may include sequentially forming a sacrificial gate material layer and a sacrificial mask layer on the insulating layer 10 and the active regions 15, patterning the sacrificial gate material layer and the sacrificial mask layer, and forming sacrificial gate patterns 20 and sacrificial mask patterns 22.

The sacrificial mask patterns 22 may be disposed on the sacrificial gate patterns 20 and may be aligned with the sacrificial gate patterns 20. For example, edge lines of the sacrificial mask patterns 22 and edge lines of the sacrificial gate patterns 20 may be aligned to together in a plan view.

In an example, the sacrificial gate patterns 20, located on the active fins 15f, may be formed to have substantially the same width.

In an example, the sacrificial gate patterns 20, located on the insulating layer 10, may be formed to have substantially the same width from a portion in contact with the sacrificial mask patterns 22 in a direction toward the insulating layer 10, and a width may be increased in a portion in contact with the insulating layer 10. Thus, a width GW2 of a lower surface of each of the sacrificial gate patterns 20, located on the insulating layer 10, may be greater than a width GW1 of an upper surface.

Gate spacers 25 may be formed on side walls of the sacrificial gate patterns 20. The gate spacers 25 may be formed of/be an insulating material such as silicon nitride, silicon oxynitride, or the like.

Source/drain regions 35 may be formed on the active regions 15 on both sides of the sacrificial gate patterns 20.

In an example, the active regions 15 on both sides of the sacrificial gate patterns 20 are etched to form recesses 30, and then an epitaxial growth process is performed to form source/drain regions 35 on the recesses 30.

Figure 15A:
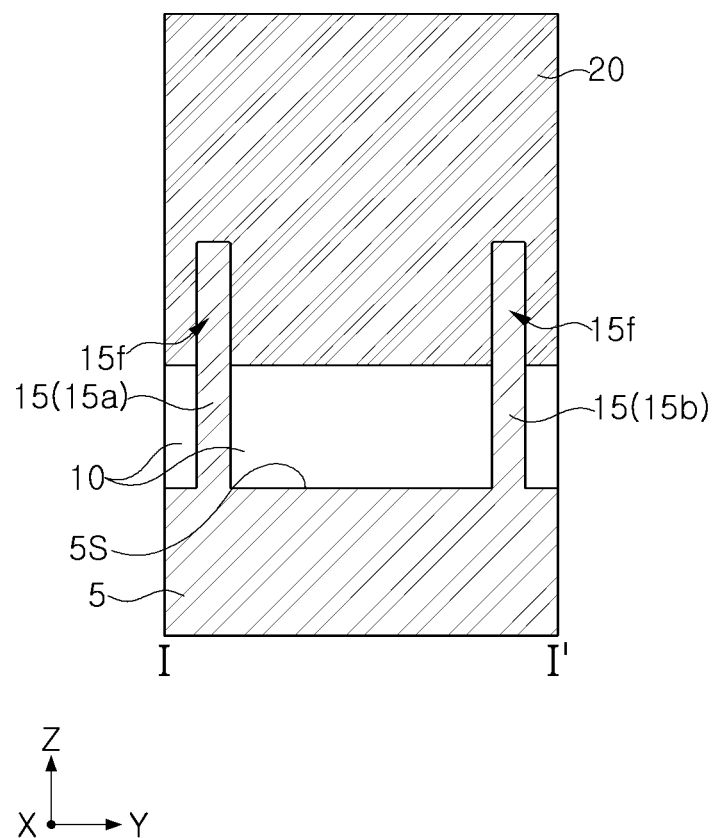
Figure 15B:
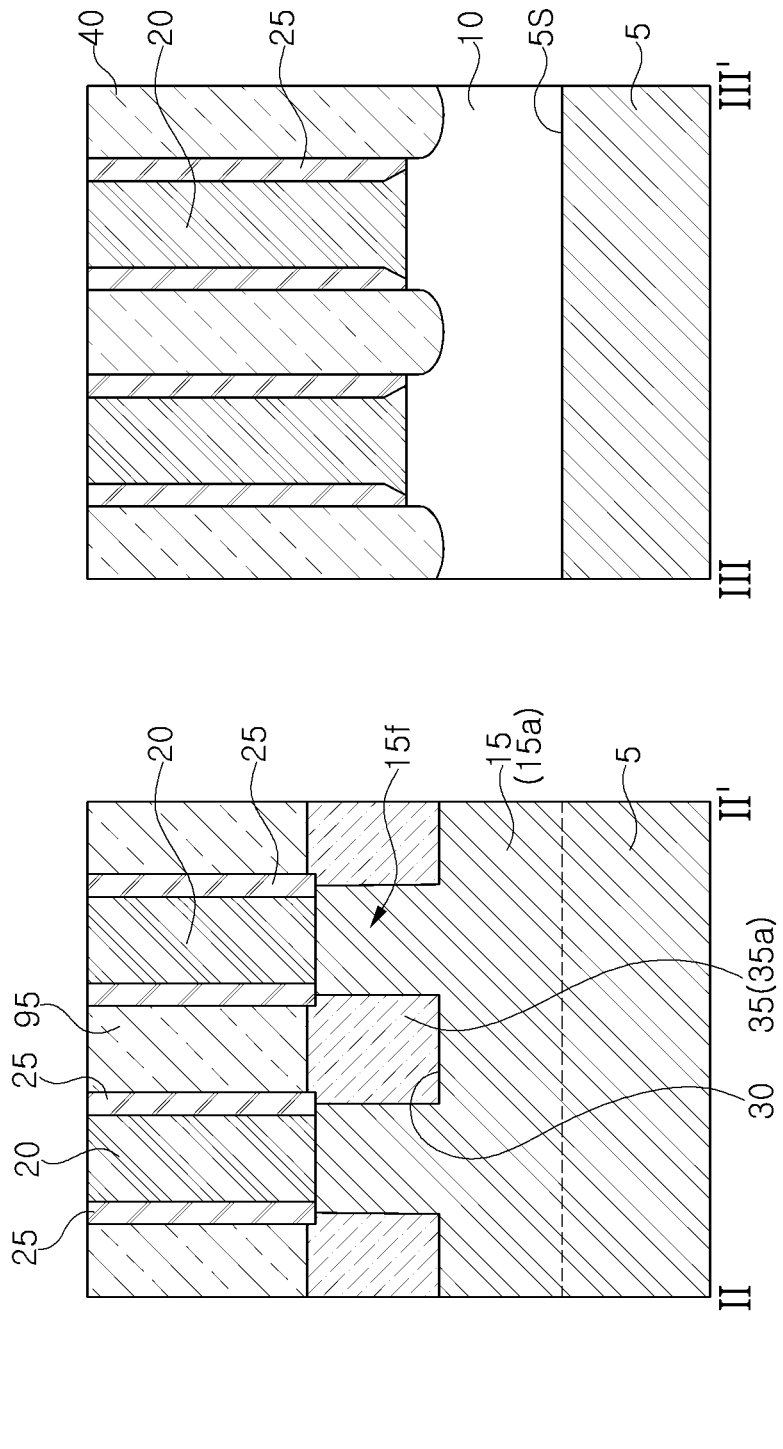

Referring to FIGS. 1, 15A, and 15B, an interlayer insulating layer 40 may be formed between the sacrificial gate patterns 20. Forming the interlayer insulating layer 40 may include forming a material layer covering the sacrificial gate patterns 20 while filling between the sacrificial gate patterns 20, and performing a planarization process until upper surfaces of the sacrificial gate patterns 20 are exposed. The planarization process may include a chemical mechanical polishing process and/or an etchback process. The sacrificial mask patterns 22 may be removed using the planarization process performed until upper surfaces of the sacrificial gate patterns 20 are exposed. Thus, the interlayer insulating layer 40 may remain between the sacrificial gate patterns 20.

Figure 16A:
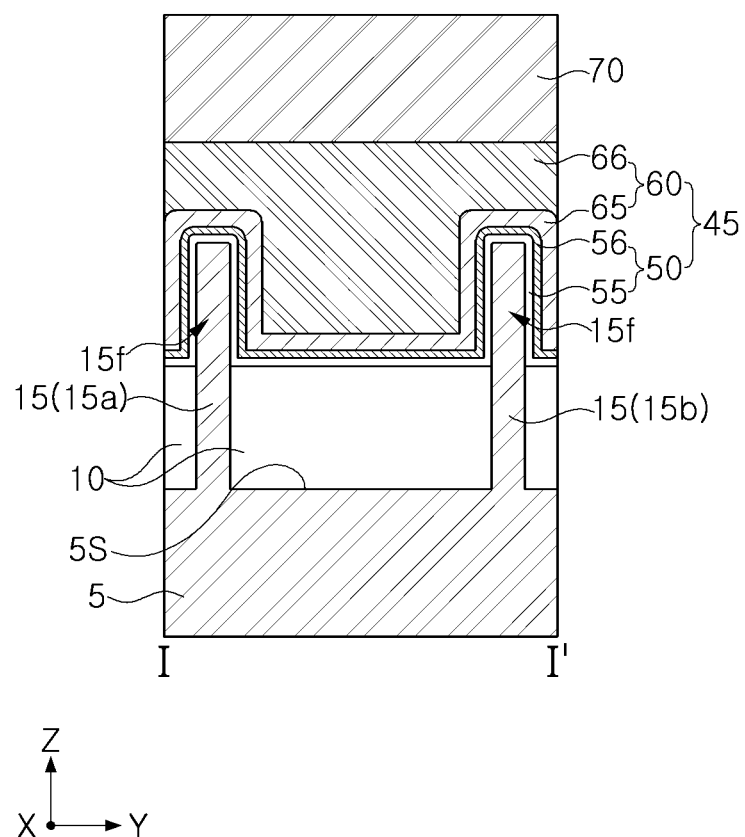
Figure 16B:
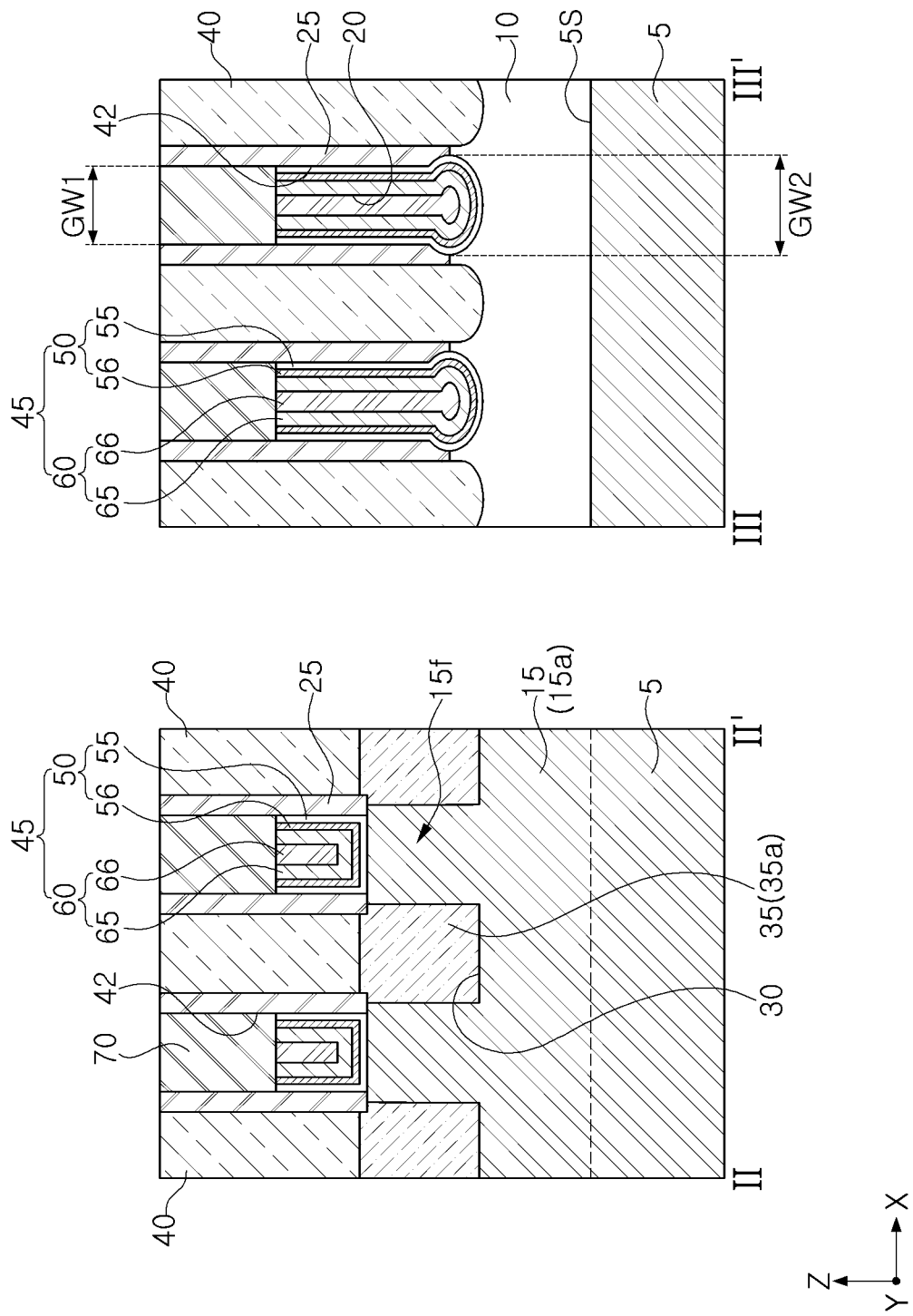

Referring to FIGS. 1, 16A, and 16B, the sacrificial gate patterns 20 are selectively removed to form gate trenches 42.

In an example, while the sacrificial gate patterns 20 are selectively removed in order to form the gate trenches 42, a portion of the insulating layer 10, located under the sacrificial gate patterns 20, may be etched. As described previously, a width of a lower surface of each of the sacrificial gate patterns 20 may be greater than a width of an upper surface. While the sacrificial gate patterns 20 with a relatively great width of the lower surface as described above are etched to be removed, a portion of the insulating layer 10 is etched to increase a width of a lower region of each of the gate trenches 42. Thus, each of the gate trenches 42 may have its maximum width GW2 in a region adjacent to a boundary region between the gate spacers 25 and the insulating layer 10, and may have a width GW1 less than the maximum width GW2 in an upper region of the gate trenches 42. For example, the gate trenches 42 may have its maximum width GW2 in the second direction X at the same level as the boundary between the gate spacers 24 and the insulating layer 10.

Gate dielectric structures 50 covering bottom surfaces and side walls of the gate trenches 42 may be formed.

In an example, forming the gate dielectric structures 50 may include sequentially forming a lower gate dielectric layer 55 and an upper gate dielectric layer 56.

Gate electrode structures 60 filling the gate trenches 42 may be formed on the gate dielectric structures 50. For example, the gate electrode structure 60 may fill the remainder of the gate trenches 42 in which the gate dielectric structures 50 are formed. For example, the gate dielectric structures 50 and the electrode structures 60 may together fill the gate trenches 42.

In an example, forming the gate electrode structures 60 may include sequentially forming a lower gate electrode layer 65 and an upper gate electrode layer 66 on the gate dielectric structures 50.

In an example, the gate electrode structures 60 and the gate dielectric structures 50 are partially etched, and gate capping patterns 70 filling the remaining portion of the gate trenches 42 may be formed on the partially formed gate electrode structures 60 and the partially formed gate dielectric structures 50. For example, upper portions of the gate electrode structures 60 and the gate dielectric structures 50 formed in the gate trenches 42 may be removed from the gate trenches 42, and the gate capping patterns 70 may be formed to fill the gate trenches 42 from which the gate electrode structures 60 and the gate dielectric structures 50 are removed.

The gate dielectric structures 50 and the gate electrode structures 60 may form gate structures 45. For example, the remaining portions of the gate electrode structures 60 in the gate trenches 42 together with the remaining portions of the gate dielectric structures 50 in the gate trenches 42 may form the gate structures 45.

Figure 17:
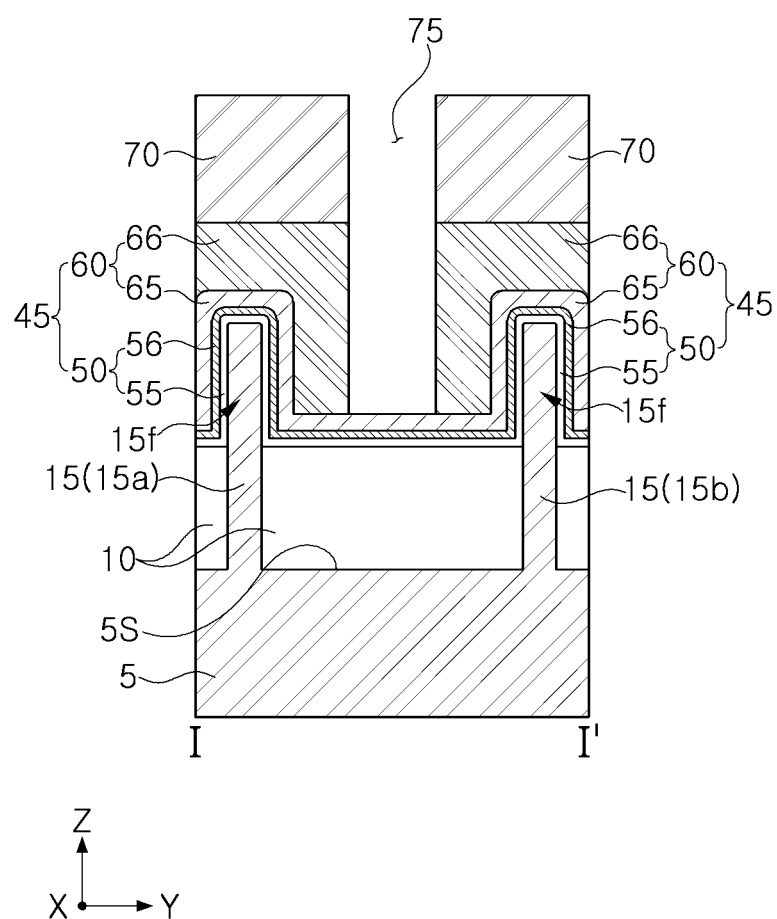

Referring to FIGS. 1 and 17, on the insulating layer 10, the gate capping patterns 70 and the gate structures 45 are patterned to form a preliminary separation hole 75. In an example, a bottom surface of the preliminary separation hole 75 is spaced apart from the gate dielectric structure 50 to be located in the gate electrode structure 60. For example, the preliminary separation hole 75 may expose a portion of the gate electrode structure 60 at a bottom of the preliminary hole 75. For example, the preliminary separation hole 75 may expose a top surface of the lower gate electrode layer 65 at the bottom of the preliminary hole 75.

Figure 18:
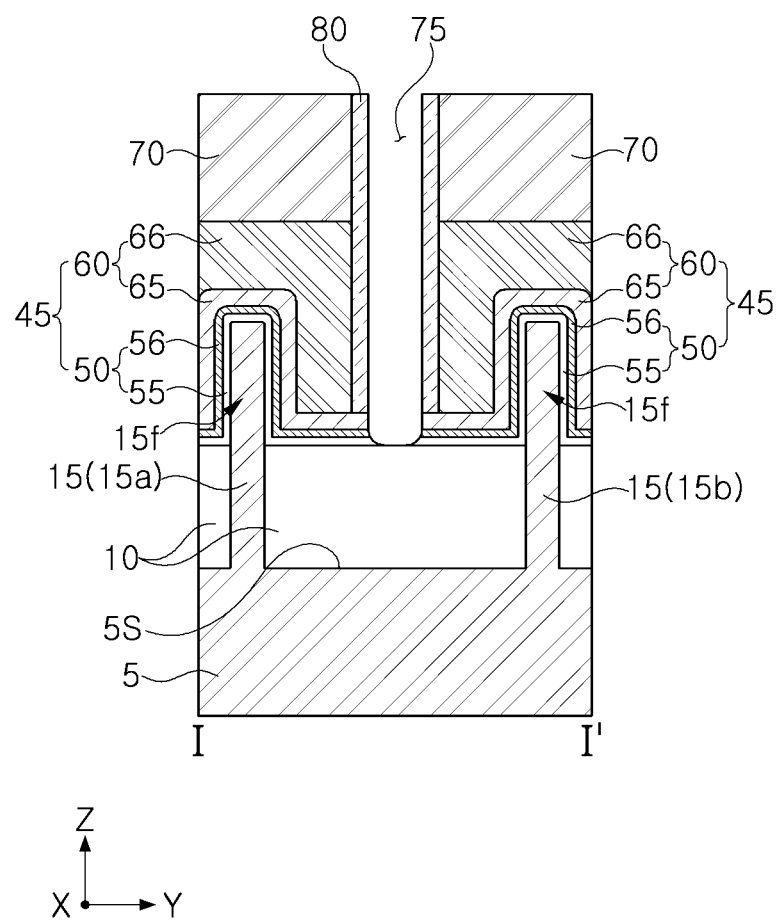

Referring to FIGS. 1 and 18, a separation spacer 80 may be formed on a side wall of the preliminary separation hole 75. The separation spacer 80 may be formed of an oxide-based insulating material or a nitride-based insulating material. For example, the bottom of the separation spacer 80 may contact the lower gate electrode layer 65.

In an example, the gate electrode structure 60 located in a lower portion of the preliminary separation hole 75 having a side wall covered by the separation spacer 80 is etched to expose the gate dielectric structure 50. Further, a portion of the gate dielectric structure 50 in a lower portion of the preliminary separation hole 75 may be etched to expose the insulating layer 10.

In another example, a process of forming the separation spacer 80 may be omitted not to form the separating spacer 80 on the side walls of the preliminary separation hole 75, and the gate structures 45 may be patterned to form a preliminary separation hole 75 exposing the gate dielectric structure 50. Here, the preliminary separation hole 75 passes through the gate dielectric structure 50 while exposing the gate dielectric structure 50 to expose the insulating layer 10.

Figure 19:
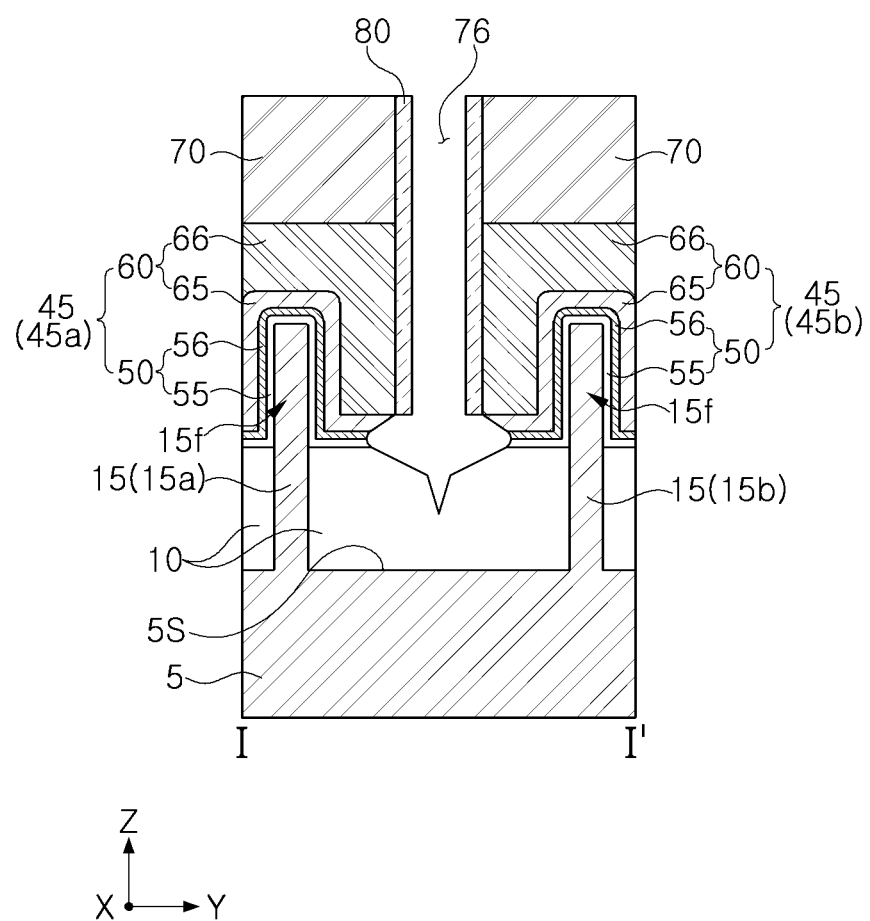

Referring to FIGS. 1 and 19, the gate dielectric structure 50, exposed by the preliminary separation hole 75, may be etched. An etching process of etching the gate dielectric structure 50 is performed, to expand the preliminary separation hole 75 to form a separation hole 76. For example, a process of etching the gate dielectric structure 50 may be performed using an etching material in which an etching rate with respect to a high-k dielectric such as $HfO_2$ is higher than an etching rate with respect to a metal material such as TiN. For example, the etching material may be a $BCl_3$ based etching material.

In an example, while etching the gate dielectric structure 50, a portion of the gate electrode structure 60 may be etched, and a portion of the insulating layer 10 may be etched. In another example, the gate dielectric structure 50 is etched, and then a portion of the gate electrode structure 60 may be etched. In a still another example, the gate dielectric structure 50 is etched, and then a portion of the gate electrode structure 60 may be etched using a cleaning process for removing an etch by-product.

Due to the separation holes 76, portions of the gate structures 45, spaced apart from each other, may be defined as a first gate structure 45a and a second gate structure 45b. For example, by forming the separation holes 76, the gate structure 45 may be separated into the first gate structure 45a and the second gate structure 45b spaced apart from each other and disposed opposite sides of the separation hole 76.

The separation spacer 80 may prevent the gate electrode structure 60 from being excessively etched while etching the gate dielectric structure 50. For example, the gate electrode structure 60, covered by the separation spacer 80, may be protected from an etching process of etching the gate dielectric structure 50, and a portion of the gate electrode structure 60, adjacent to the gate dielectric structure 50, may be etched while etching the gate dielectric structure 50.

Next, referring to FIGS. 1, 2, and 19, in an example, the separation spacer 80 is removed, and then a separation structure 85 filling the separation hole (76 of FIG. 19) may be formed.

In a modified example, referring to FIGS. 11 and 19, while the separation spacer 80 remains, a separation gap-fill pattern 81 filling the separation hole (76 of FIG. 19) may be formed.

According to the example embodiment described above, the extended portion 85E of the separation structure 85 is disposed between the gate structures 45, is extended into the gate structures 45, and overlaps the gate electrode structures 60 of the gate structures 45, e.g., in the vertical direction Z. The separation structure 85, including the extended portion 85E described above, may prevent a leakage current or an electrical short, which may occur between the gate structures 45 having end portions facing each other.

As set forth above, according to example embodiments of the present inventive concept, a semiconductor device including gate structures and a separation structure between end portions of the gate structures may be provided. The separation structure may include an extended portion disposed between the gate structures, extended into the gate structures, and overlapping the gate structures. The separation structure, including the extended portion described above, may prevent/reduce a leakage current or an electrical short, which may occur between the gate structures having end portions facing each other.

According to example embodiments, electrical characteristics of a semiconductor device including a separation structure and a gate structure may be improved. The separation structure and the gate structure, described above, may be beneficial to provide a more highly integrated semiconductor device.

While example embodiments have been shown and described above, it will be apparent to those skilled in the art that modifications and variations could be made without departing from the scope of the present disclosure, as defined by the appended claims.

What is claimed is:

1. A semiconductor device, comprising:
   a first active fin and a second active fin disposed on a substrate;
   an insulating layer disposed between the first active fin and the second active fin and on the substrate;
   first active layers on the first active fin, the first active layers being spaced apart from each other in a vertical direction perpendicular to an upper surface of the substrate;

second active layers on the second active fin, the second active layers being spaced apart from each other in the vertical direction;

a first gate structure intersecting the first active layers and extending in a first direction, the first gate structure surrounding each of the first active layers;

a second gate structure intersecting the second active layers and extending in the first direction, the second gate structure surrounding each of the second active layers; and a separation structure disposed between the first gate structure and the second gate structure, and extending into the insulating layer, wherein the first gate structure has a first end portion disposed on the insulating layer;

wherein the second gate structure has a second end portion facing the first end portion of the first gate structure in the first direction, wherein the first gate structure includes a first gate dielectric structure and a first gate electrode structure on the first gate dielectric structure, wherein the second gate structure includes a second gate dielectric structure and a second gate electrode structure on the second gate dielectric structure, wherein the separation structure contacts the first end portion of the first gate structure, the second end portion of the second gate structure, and the insulating layer, wherein the separation structure includes a maximum width portion, a lower portion below the maximum width portion and contacting the insulating layer, and an upper portion on the maximum width portion, and wherein the maximum width portion includes a first portion between the first gate electrode structure and the insulating layer, a second portion between the second gate electrode structure and the insulating layer, and a third portion between the first portion and the second portion.

2. The semiconductor device of claim 1, wherein the insulating layer has an upper surface contacting the first gate structure, and wherein the maximum width portion is at a higher level than the upper surface of the insulating layer.

3. The semiconductor device of claim 1, wherein in the vertical direction from the lower portion to the upper portion, the lower portion includes a portion of which width is gradually increased.

4. The semiconductor device of claim 3, wherein a maximum width of the upper portion in the first direction is greater than a maximum width of the portion of the lower portion in the first direction.

5. The semiconductor device of claim 1, wherein the first gate dielectric structure includes first dielectric portions contacting the first active layers and a second dielectric portion contacting the insulating layer.

6. The semiconductor device of claim 5, wherein the first portion of the maximum width portion contacts the second dielectric portion.

7. The semiconductor device of claim 5, wherein the first gate electrode structure includes a first electrode layer contacting the first gate dielectric structure, and a second electrode layer on the first electrode layer.

8. The semiconductor device of claim 7, wherein the first electrode layer and the second electrode layer contact the separation structure.

9. The semiconductor device of claim 7, wherein the maximum width portion contacts the second dielectric portion, the first electrode layer and the insulating layer.

10. The semiconductor device of claim 9, wherein the second electrode layer contacts the upper portion of the separation structure.

11. The semiconductor device of claim 7, wherein a space between the first active layers is filled with the first dielectric portions and the first electrode layer, and is not filled with the second electrode layer.

12. A semiconductor device, comprising:
a first active fin and a second active fin disposed on a substrate;

an insulating layer disposed between the first active fin and the second active fin and on the substrate;

first active layers on the first active fin, the first active layers being spaced apart from each other in a vertical direction perpendicular to an upper surface of the substrate;

second active layers on the second active fin, the second active layers being spaced apart from each other in the vertical direction;

a first gate structure intersecting the first active layers and extending in a first direction, the first gate structure surrounding each of the first active layers;

a second gate structure intersecting the second active layers and extending in the first direction, the second gate structure surrounding each of the second active layers; and a separation structure disposed between first gate structure and the second gate structure, and extending into the insulating layer, wherein the first gate structure has a first end portion disposed on the insulating layer;

wherein the second gate structure has a second end portion facing the first end portion of the first gate structure in the first direction, wherein the separation structure contacts the first end portion of the first gate structure, the second end portion of the second gate structure, and the insulating layer, wherein the separation structure includes a lower portion contacting the insulating layer, an intermediate portion on the lower portion, and an upper portion on the intermediate portion, a maximum width of the intermediate portion of the separation structure in the first direction is greater than a maximum width of the lower portion of the separation structure in the first direction, and the maximum width of the intermediate portion of the separation structure in the first direction is greater than a maximum width of the upper portion of the separation structure in the first direction, wherein the first gate structure includes a first gate dielectric structure and a first gate electrode structure on the first gate dielectric structure, wherein the second gate structure includes a second gate dielectric structure and a second gate electrode structure on the second gate dielectric structure, wherein the intermediate portion of the separation structure includes a first portion vertically overlapping the first gate electrode structure and a second portion vertically overlapping the second gate electrode structure, wherein a first boundary between a side wall of the intermediate portion and a side wall of the upper portion is at a higher level than a lower surface of the first gate electrode structure, and is at a lower level than an upper surface of the first gate electrode structure, and wherein a second boundary between the side wall of the intermediate portion and a side wall of the lower portion is at a higher level than a lower surface of the insulating layer, and is at a lower level than an upper surface of the insulating layer.

13. The semiconductor device of claim 12, wherein the intermediate portion of the separation structure includes a first intermediate portion and a second intermediate portion on the first intermediate portion, in the vertical direction from the lower portion to the upper portion, the first intermediate portion includes a portion of which width is gradually increased, and the second intermediate portion includes a portion of which width is gradually decreased.

14. The semiconductor device of claim 13, wherein the first intermediate portion has an inclined first side wall, and the second intermediate portion has an inclined second side wall.

15. The semiconductor device of claim 14, wherein the lower portion has inclined lower side walls, and an angle between the lower side walls is different from an angle between the first side wall of the first intermediate portion and the second side wall of the second intermediate portion.

16. The semiconductor device of claim 12, wherein the first gate dielectric structure contacts the first active layers, and wherein the first gate electrode structure includes a first electrode layer contacting the first gate dielectric structure, and a second electrode layer on the first electrode layer.

17. The semiconductor device of claim 16, wherein the first electrode layer contacts at least a portion of the intermediate portion of the separation structure, and wherein the second electrode layer contacts the upper portion of the separation structure.

18. A semiconductor device, comprising:

a substrate;

an active fin and an insulating layer on the substrate;

a first source/drain region and a second source/drain region on the active fin and spaced apart from each other;

active layers between the first source/drain region and the second source/drain region, the active layers being spaced apart from each other in a vertical direction perpendicular to an upper surface of the substrate;

a gate structure intersecting the active layers and extending in a first direction, the gate structure surrounding each of the active layers; and a separation structure on the insulating layer and contacting the gate structure, wherein the gate structure has an end portion on the insulating layer, wherein the separation structure contacts the insulating layer and the end portion of the gate structure, wherein the gate structure includes a gate dielectric structure and a gate electrode structure on the gate dielectric structure, wherein the gate dielectric structure contacts the active layers, wherein the separation structure includes a side wall extending into the insulating layer and being in contact with the end portion of the gate structure, wherein the side wall of the separation structure includes a lower side wall, a first side wall on the lower side wall, a second side wall on the first side wall, and an upper side wall on the second side wall, wherein an inclination of the lower side wall is greater than an inclination of the first side wall with respect to a boundary surface between the gate structure and the insulating layer, wherein the first side wall includes a portion in contact with the insulating layer, wherein the second side wall includes a portion in contact with the gate electrode structure, and wherein a portion of the separation structure defined between the first side wall and the second side wall overlaps the gate electrode structure in a plan view.

19. The semiconductor device of claim 18, wherein the gate dielectric structure includes a first dielectric portions contacting the active layers and a second dielectric portion contacting the insulating layer, and wherein the gate electrode structure includes a first electrode layer contacting the gate dielectric structure, and a second electrode layer on the first electrode layer.

20. The semiconductor device of claim 19, wherein the first electrode layer, the second electrode layer and the second dielectric portion contact the side wall of the separation structure.

* * * * *